(12) United States Patent
Wei et al.

(10) Patent No.: US 11,474,141 B1
(45) Date of Patent: Oct. 18, 2022

(54) METHODS AND APPARATUSES FOR IDENTIFYING TRANSMISSION LINES VIA IMPEDANCE INHOMOGENEITY PATTERNS

(71) Applicants: University of Rhode Island Board of Trustees, Kingston, RI (US); The Curators of the University of Missouri, Columbia, MO (US)

(72) Inventors: Tao Wei, West Kingston, RI (US); Jie Huang, Rolla, MO (US)

(73) Assignees: University of Rhode Island Board of Trustees, Kingston, RI (US); The Curators of the University of Missouri, Columbia, MO (US)

( * ) Notice: Subject to any disclaimer, the term of this patent is extended or adjusted under 35 U.S.C. 154(b) by 2 days.

(21) Appl. No.: 16/784,130

(22) Filed: Feb. 6, 2020

Related U.S. Application Data

(60) Provisional application No. 62/801,920, filed on Feb. 6, 2019.

(51) Int. Cl.
  *G01R 31/11*  (2006.01)
  *G01R 31/58*  (2020.01)
  *G01R 31/08*  (2020.01)

(52) U.S. Cl.
  CPC ............ *G01R 31/11* (2013.01); *G01R 31/088* (2013.01); *G01R 31/58* (2020.01)

(58) Field of Classification Search
  CPC ....... G01R 31/11; G01R 31/088; G01R 31/58
  See application file for complete search history.

(56) References Cited

U.S. PATENT DOCUMENTS 5,053,693 A * 10/1991 Bohnert ................. G01R 29/12
324/96
6,644,114 B1    11/2003 McEwan
(Continued)

OTHER PUBLICATIONS

Hartog, A. H., "Advances in optical time domain reflectometry", Symposium on Optical Fiber Measurements, Mar. 1, 1984, 89-94.
(Continued)

*Primary Examiner* — Farhana A Hoque
(74) *Attorney, Agent, or Firm* — Peacock Law P.C.; Philip D. Askenazy

(57) ABSTRACT

Methods and apparatuses for using the impedance inhomogeneity pattern (IIP) of a transmission line, or one or more segments thereof, to verify the identity of the transmission line and/or detect whether or not the transmission line has been altered or tampered with. Because the impedance inhomogeneity pattern of a transmission line is unique, unpredictable, and uncontrollable, it can be used as a physical unclonable function (PUF). The IIP can be obtained by a method such as frequency domain reflectometry or time domain reflectometry, and is then compared with a previously stored intrinsic IIP obtained from a transmission line (or segment(s)) prior to first use through the use of, for example, correlation or coherence functions. The method can be used on any transmission line, including electrical, optical and acoustic transmission lines. The method is useful for enabling or enhancing physical layer communication link security, transmission line sensing security, supply chain security, product authentication, physical encryption, anti-counterfeiting, manufacturing traceability, and the like.

20 Claims, 16 Drawing Sheets

(56) References Cited

U.S. PATENT DOCUMENTS

| | | | |
|---|---|---|---|
| 6,980,028 B1 | 12/2005 | Plants et al. | |
| 9,143,236 B1 | 9/2015 | Bartur et al. | |
| 2002/0130667 A1* | 9/2002 | Noe | G01R 31/11 324/534 |
| 2003/0038618 A1 | 2/2003 | Gumm | |
| 2003/0235306 A1 | 12/2003 | Fox et al. | |
| 2005/0068244 A1* | 3/2005 | Downs | H01Q 21/0006 343/797 |
| 2005/0264297 A1 | 12/2005 | Gorka | |
| 2005/0270091 A1* | 12/2005 | Kozyrev | H03F 7/00 330/4.5 |
| 2006/0261259 A1 | 11/2006 | Beinhocker | |
| 2008/0048726 A1 | 2/2008 | Hafed | |
| 2009/0218401 A1 | 9/2009 | Moran et al. | |
| 2009/0315565 A1 | 12/2009 | Wyar et al. | |
| 2010/0073014 A1 | 3/2010 | Maslen | |
| 2010/0118292 A1 | 5/2010 | Park et al. | |
| 2010/0277184 A1* | 11/2010 | Geren | G01R 27/00 324/638 |
| 2011/0181871 A1 | 7/2011 | Childers et al. | |
| 2019/0129026 A1* | 5/2019 | Sumi | G01S 15/8997 |

OTHER PUBLICATIONS

Rixner, S., et al., "Memory access scheduling", ACM SIGARCH Computer Architecture News, vol. 28, No. 2, ACM, 2000, 128-138.

Rogers, B., et al., "Using address independent seed encryption and bonsai merkle trees to make secure processors os-and performance-friendly", Proceedings of the 40th Annual IEEE/ACM International Symposium on Microarchitecture, IEEE Computer Society, 2007, 183-196.

Sadeghi, A. R., et al., "Security and privacy challenges in industrial internet of things", 2015 52nd ACM/EDAC/IEEE Design Automation Conference (DAC), IEEE, 2015, 1-6.

Saileshwar, G., et al., "Morphable counters: Establishing compact integrity trees for low-overhead secure memories", 2018 51st Annual IEEE/ACM International Symposium on Microarchitecture (MICRO), IEEE, 2018, 416-427.

Saileshwar, G., et al., "Synergy: Rethinking secure-memory design for error-correcting memories", 2018 IEEE International Symposium on High Performance Computer Architecture (HPCA), IEEE, 2018, 454-465.

Santos, N., et al., "Towards Trusted Cloud Computing", HotCloud, vol. 9, No. 9, 2009, 3.

Seaborn, M., et al., "Exploiting the DRAM rowhammer bug to gain kernel privileges", Black Hat, vol. 15, 2015.

Sehatbakhsh, N., et al., "Emma: Hardware/software attestation framework for embedded systems using electromagnetic signals", Proceedings of the 52nd Annual IEEE/ACM International Symposium on Microarchitecture, Association for Computing Machinery, 2019, 983-995.

Smith, S. W., et al., "Building a high-performance, programmable secure coprocessor", Computer Networks, Vo. 31, No. 8, 1999, 831-860.

Stefanov, E., et al., "Path ORAM: an extremely simple oblivious RAM protocol", Proceedings of the 2013 ACM SIGSAC Conference on Computer & Communications Security, ACM, 2013, 299-310.

Adam, D.S. Christian, et al., "Analog-to-Probability Conversion-Efficient Extraction of Information Based on Stochastic Signal Models", Progress in Industrial Mathematics at ECMI 2018, Springer International Publishing, 2019, 583-587.

Barnoski, M. K., et al., "Fiber waveguides: a novel technique for investigating attenuation characteristics", Appl. Opt., vol. 15, No. 9, 1976, 2112-2115.

Bishop, J. A., et al., "A Rapid-Acquisition Electrical Time-Domain Reflectometer for Dynamic Structure Analysis", IEEE Trans. Instrum. Meas., vol. 60, No. 2, 2011, 655-661.

Chen, Zhen, et al., "FiberID: Molecular-level secret for identification of things", 2014 IEEE International Workshop on Information Forensics and Security, 10.1109/WIFS.2014.7084308, 2014.

Chen, X., et al., "University Fiber for Short-Distance Optical Communications", J. Light Technol., vol. 37, No. 2, 2019, 389-395.

Dong, X., et al., "Combined Attenuation and High-Resolution Fault Measurements Using Chaos-OTDR", IEEE Photonics J., vol. 7, No. 6, 2015, 1-6.

Du, Y., et al., "Unclonable optical fiber identification based on Rayleigh backscattering signatures", J. Lightw. Technol., vol. 35, No. 21, Nov. 1, 2017, 4634-4640.

Froggatt, M., et al., "High-spatial-resolution distributed strain measurement in optical fiber with Rayleigh scatter", Applied Optics, vol. 37, Apr. 1, 1998, 1735-1740.

Getsinger, W. J., "An introduction to microwave transmission lines", Proc. 35th Midwest Symp. Circuits Syste., vol. 2, 1992, 1016-1019.

He, H., et al., "Self-mixing demodulation for coherent phase-sensitive OTDR system", Sensors, vol. 16, No. 5, 2016, 681-690.

Herder, C., et al., "Physical unclonable functions and applications: A tutorial", Proc. IEEE, vol. 102, No. 8, Aug. 2014, 1126-1141.

Jain, A. K., et al., "IEEE Trans. Circuits Syst. Video Technol.", vol. 14, No. 1, Jan. 2004, 4-20.

Kim, Y., et al., "Analyzing OTDR Measurement Data Using the Kalman Filter", IEEE Trans. Instrum. Meas., vol. 57, No. 5, 2008, 947-951.

Kuznia, C., et al., "Novel high-resolution OTDR technology for multi-Gbps transceivers", OFR 2014, Optical Society of America, 2014, 1-3.

Laferriere, S. W.J., et al., "Reference Guide to Fiber Optic Testing, Second Edition, vol. 1", JDS Uniphase Corporation, 2011.

Lee, D., et al., "Optimization of SNR Improvement in the Noncoherent OTDR Based on Simplex Codes", J. Light. Technol., vol. 24, No. 1, 2006, 322.

Lunglmay, M., et al., "Linearized Bregman Iterations for Automatic Optical Fiber Fault Analysis", IEEE Trans. Instrum. Meas., vol. 68, No. 10, 2019, 3699-3711.

Maricevic, Z. A., et al., "Timedomain measurements with Hewlett-Packard network analyzer HP 8510 using the matrix pencil method", IEEE Trans. Microw. Theory Techn., vol. 39, No. 3, Mar. 1991, 538-547.

Nakazawa, M., "Rayleigh Backscattering Theorty for Single-Mode Optical Fibers", J. Opt. Soc. Am., vol. 73, No. 9, 1983, 1175-1180.

Naraghi, S., "Time-Based Analog in Digital Converters", Ph. D. Dissertation, University of Michigan, 2009.

Parkin, N., et al., "Gigabit SFP transceiver with integrated optical time domain reflectometer for ethernet access services", 39th European Conference and Exhibition on Optical Communications (ECOC 2013), 2013, 1-3.

Razavi, B., "Design of Analog CMOS Integrated Circuits, Second Edition", McGraw Hill Education, 2017, 704.

Riera, A., et al., "Unobstrusive biometric system based on electroencephalogram analysis", EURASIP J. Adv. Signal Process, vol. 2008, Oct. 2007, 1-8.

Stove, A. G., "Linear FMCW radar techniques", IEEE Proc. F Radar Signal Process., vol. 139, No. 5, Oct. 1992, 343-350.

Tateda, Mitshuhiro, et al., "Advances in optical time domain reflectometry", Journal of Lightwave Technology, vol. 7, No. 8, Aug. 1989, 1217-1224.

Yao, Z., et al., "Digitally Integrated Self-Trained Predistortion Curve Finder for Passive Sweep Linearization of Semiconductor Lasers", IEEE J. Sel. Top. Quantum Electron., vol. 25, No. 6, Nov. 12, 2019.

Yao, Z., et al., "Low-cost optical fiber physical unclonable function reader baed on a digitally integrated semiconductor LiDAR", Appl. Opt., vol. 58, No. 23, Aug. 10, 2019, 6211-6216.

Zhu, C., et al., "Truly distributed coaxial cable sensing based on random inhomogeneities", IEEE Trans. Instrum. Meas., vol. 68, No. 11, Nov. 2019, 4600-4607.

Zinsou, R., et al., "Recent progress in the performance enhancement of phase-sensitive OTDR vibration sensing systems", Sensors, vol. 19, No. 7, 2019, 1709-1728.

(56) References Cited

OTHER PUBLICATIONS

Saileshwar, G., et al., "Morphable counters: Enablishing compact integrity trees for low-overhead secure memories", 2018 51st Annual IEEE/ACM International Symposium on Microarchitecture (MICRO), IEEE, 2018, 416-427.
Suh, G. E., et al., "AEGIS: architecture for tamper-evident and tamper-resistance processing", ACM International Conference on Supercomputing 25th Anniversary Volume, ACM, 2014, 357-368.
Suh, G. E., et al., "Design and implementation of the AEGIS single-chip secure processor using physical random functions", ACM SIGARCH Computer Architecture News, vol. 33, No. 2, IEEE Computer Society, 2005, 25-36.
Suh, G. E., et al., "Physical unclonable functions for device authentication and secret key generation", 2007 44th ACM/IEEE Design Automation Conference, IEEE, 2007, 9-14.
Trusted Computing Group, "Trusted Platform Module (TPM) Summary", https://trustedcomputinggroup.org/resource/trusted-platform-module-tpm-summary, downloaded Mar. 1, 2021, 2008.
Van Bulck, J., et al., "Foreshadow: Extracting the keys to the intel {SGX} kingdom with transient out-of-order execution", 27th {USENIX} Security Symposium ({USENIX} Security 18), 2018, 991-1008.
Vogt, P., et al., "Cross Site Scripting Prevention with Dynamic Data Tainting and Static Analysis", NDSS, vol. 2007, 2007, 12.
Wang, R., et al., "D-ORAM: Path-ORAM delegation for low execution interference on cloud servers with untrusted memory", 2018 IEEE International Symposium on High Performance Computer Architecture (HPCA), IEEE, 2018, 416-427.
Wang, Y., et al., "SecDCP: secure dynamic cache partitioning for efficient timing channel protection", Proceedings of the 53rd Annual Design Automation Conference, ACM, 2016, 74.
Weisse, O., et al., "NDA: Preventing Speculative Execution Attaches at Their Source", Proceedings of the 52nd Annual IEEE/ACM International Symposium on Microarchitecture, ACM, 2019, 572-586.
Whetsel, L., "An IFFF 1149.1 Based Logic/Signature Analyzer in a Chip", ITC, 1991, 869-878.
Yan, C., et al., "Improving cost, performance, and security of memory encryption and authentication", ACM SIGARCH Computer Architecture News, vol. 34, No. 2, IEEE Computer Society, 2006, 179-190.
Yang, K., et al., "A2: Analog malicious hardware", 2016 IEEE Symposium on Security and Privact (SP), IEEE, 2016, 18-37.
Kang, J., et al., "Fast Secure Processor for inhibiting software piracy and tampering", Proceedings of the 36th Annual IEEE/ACM International Symposium on Microarchitecture, IEEE Computer Society, 2003, 351.
Yao, Z., et al., "Low-cost optical fiber physical unclonable function reader based on a digitally integrated semiconductor LiDAR", Applied Optics, vol. 58, No. 23, Aug. 2019, 6211-6216.
Yitbarek, S. F., et al., "Cold boot attacks are still hot: Security analysis of memory scramblers in modern processors", 2017 IEEE International Symposium on High Performance Computer Architecture (HPCA), IEEE, 2017, 313-324.
Young, V., et al., "DEUCE: Write-efficient encryption for non-volatile memories", ACM SIGPLAN Notices, vol. 50, No. 4, 2015, 33-44.
Zhang, F., et al., "Robust counterfeit pcb detection exploting intrinsic trace impedance variations", 2015 IEEE 33rd VLSI Test Symposium (VTS), IEEE, 2015, 1-6.
Baumann, A., et al., "Shielding applications from an untrusted cloud with haven", ACM Transactions on Computer Systems (TOCS), vol. 33, No. 3, 2015, 8.
Bellare, M., et al., "A concrete security treatment of symmetric encryption", Proceedings 38th Annual Symposium on Foundations of Computer Science, IEEE, 1997, 394-403.
Bellare, M., et al., "Keying hash functions for message authentication", Annual International Cryptology Conference, Springer, 1996, 1-15.

Champagne, D., et al., "Scalable Architectural support for trusted software", HPCA-16 2010 The Sixteenth International Symposium on High-Performance Computer Architecture, IEEE, 2010, 1-12.
Chari, S., et al., "Towards sound approaches to counteract power-analysis attacks", Annual International Cryptology Conference, Springer, 1999, 398-412.
Corey, S. D., et al., "Interconnect characterization using time-domain reflectometry", IEEE Transactions on Microwave Theory and Techniques, vol. 43, No. 9, 1995, 2151-2156.
Costan, V., et al., "Sanctum: Minimal hardware extensions for strong software isolation", 25th (USENIX) Security Symposium ({USENIX} Security 16), 2016, 857-874.
Cowan, C., et al., "Buffer overflows: Attacks and defenses for the vulnerability of the decade", Proceedings DARPA Information Survivability Conference and Exposition DISCEX '00, vol. 2, IEEE, 2000, 119-129.
Cuppu, V., et al., "A performance comparison of contemporary DRAM architectures", ACM SIGARCH Computer Architecture News, vol. 27, No. 2, IEEE Computer Society, 222-233, 1999.
EE Times, "Maxim: Secure Supervisor ic has active tamper detection", https://www.eetimes.com/maxim-secure-supervisor-ic-has-active-tamper-detection, downloaded Mar. 1, 2021, 2009.
Fang, H., et al., "Prefetch-guard: Leveraging hardware prefetches to defend against cache timing channels", 2018 IEEE International Symposium on Hardware Oriented Security and Trust (HOST), IEEE, 2018, 187-190.
Fletcher, C. W., et al., "Freecursive oram: [nearly] free recursion and integrity verification for position-based oblivious ram", ACM SIGARCH Computer Architecture News, vol. 43, No. 1, 2015, 103-116.
Gruss, D., et al., "Rowhammer.js: A remote software-induced fault attack in javascript", International Conference on Detection of Intrusions and Malware, and Vulnerability Assessment, Springer, 2016, 300-321.
Gupta, S., et al., "Cross-Site Scripting (XSS) attacks and defense mechanisms: classification and state-of-the-art", International Journal of System Assurance Engineering and Management, vol. 8, No. 1, 2017, 512-530.
Halderman, J. A., et al., "Lest we remember: cold-boot attacks on encryption keys", Communications of the ACM, vol. 52, No. 5, 2009, 91-98.
Hastings, A., "Are Computer Architects to Blame for the State of Security Today?", https://www.sigarch.org/are-computer-architects-to-blame-for-the-state-of-security-today/, downloaded Mar. 1, 2021, 2019.
Henson, M., et al., "Memory encryption: A survey of existing techniques", ACM Computering Surveys (CSUR), vol. 46, No. 4, 2014, 53.
Herder, C., et al., "Physical unclonable functions and applications: A tutorial", Proceedings of the IEEE, vol. 102, No. 8, 2014, 1126-1141.
Hinaga, S., et al., "Thermal effects on pcb laminate material dielectric constant and dissipation factor", IPC APEX EXPO, 2010.
Jupiter Instruments, "I2C bus monitor", http://www.jupiter.com/, downloaded Mar. 1, 2021.
Kim, J. S., et al., "The DRAM latency PUF: Quickly evaluating physical unclonable functions by exploiting the latency-reliability tradeoff in modern commodity DRAM Devices", 2018 IEEE International Symposium on High Performance Computer Architecture (HPCA), IEEE, 2018, 194-207.
Kiriansky, V., et al., "DAWG: A defense against cache timing attacks in speculative execution processors", 2018 51st Annual IEEE/ACM International Symposium on Microarchitecture (MICRO), IEEE, 2018, 974-987.
Kocher, P., et al., "Spectre attacks: Exploiting speculative execution", 2019 IEEE Symposium on Security and Privacy (SP), IEEE, 2019, 1-19.
Lee, D., et al., "A 16ps-resolution random equivalent sampling circuit for tdr utilizing a vernier time delay generation", 2003 IEEE Nuclear Science Symposium Conference Record (IEEE Cat. No. 03CH37515), vol. 2, IEEE, 2003, 1219-1223.
Lie, D., et al., "Architectural support for copy and tamper resistant software", Acm Sigplan Notices, vol. 35, No. 11, 2000, 168-177.

(56) References Cited

OTHER PUBLICATIONS

Lipp, M., et al., "Meltdown: Reading kernel memory from use space", 27th {USENIX} Security Symposium ({USENIX} Security 18), 2018, 973-990.
Liu, X., et al., "When good becomes evil: Keystroke inference with smartwatch", Proceedings of the 22nd ACM SIGSAC Conference on Computer and Co9mmunications Security, ACM, 2015, 1273-1285.
Maas, M., et al., "Phantom: Practical oblivious computation in a secure processor", Proceedings of the 2013 ACM SIGSAC Conference on Computer & Communications Security, ACM, 2013, 311-324.
Manich, S., et al., "Detection of probing attempts in secure ics", 2012 IEEE International Symposium on Hardware-Oriented Security and Trust, IEEE, 2012, 134-139.
Maxim Integrated, "DS3645: 4KB Secure Memory with Tamper Protecton for Network Server Applications", https://www.maximintegrated.com/en/products/embedded-security/security-managers/DS3645.html, downloaded Mar. 1, 2021.
McKeen, F., et al., "Innovative instructions and software model for isolated execution", Hasp (R) isca, vol. 10, No. 1, 2013.
Meijer, C., et al., "Self-encrypting deception: weaknesses in the encryption of solid state drives", 2019 IEEE Symposium on Security and Privacy (SP), IEEE, 2019, 72-87.
Messerges, T. S., et al., "Examining smart-card security under the threat of power analysis attacks", IEEE Transactions on Computers, vol. 51, No. 5, 2002, 541-552.
Paley, S., et al., "Active protection against pcb physical tampering", 2016 17th International Symposium on Quality Electronic Design (ISQED), IEEE, 2016, 356-361.
Park, B., et al., "A metal-via resistance based physically unclonable function with 1.18% native instability", 2019 IEEE Custom Integrated Circuits Conference (CICC), IEEE, 2019, 1-4.
Purisima, M. C.L., et al., "Fpga implementation of a time domain reflectometry (tdr) system for slope monitoring applications", TENCON 2010-2010 IEEE Region 10 Conference, 2010, 1198-1202.
Quisquater, J. J., et al., "Electromagnetic analysis (ema): Measures and counter-measures for smart cards", International Conference on Research in Smart Cards, Springer, 2001, 200-210.
Raguram, R., et al., "iSpy: automatic reconstruction of typed input from compromising reflections", Proceedings of the 18th ACM Conference on Computer and Communications Security, ACM, 2011, 527-536.
Ren, L., et al., "Design and implementation of the ascend secure processor", IEEE Transactions and Dependable and Secure Computing, vol. 16, No. 2, 2017, 204-216.
Aga, S., et al., "Invisimem: Smart memory defenses for memory bus side channel", ACM SIGARCH Computer Architecture News, vol. 45, No. 2, 2017, 94-106.
Aleph, O., "Smashing the stack for fun and profit", http://www.shmoo.com/phrack/Phrack49/p49-14, downloaded Mar. 1, 2021, 1996.
ARM Architecture, "Security technology building a secure system using trustzone technology", (White Paper), 2009.
Arnautov, S., et al., "(SCONE): Secure linux containers with intel (SGX)", 12th (USENIX) Symposium on Operating Systems Design and Implementation, 2016, 689-703.
Arnold, T. W., et al., "IBM 4765 cryptographic coprocessor", IBM Journal of Research and Development, vol. 56, No. 1.2, 2012, 10-11.
Awad, A., et al., "Obfusmem: A low-overhead access obfuscation for trusted memories", ACM SIGARCH Computer Architecture News, vol. 45, No. 2, ACM, 2017, 107-119.
Awad, A., et al., "Triad-nvm: Persistency for integrity-protected and encpted non-volatile memories", Proceedings of the 45th International Symposium on Computer Architecture, ACM, 2019, 104-115.
Aziz, P. M., et al., "An overview of sigma-delta converters", IEEE Signal Processing Magazine, vol. 13, No. 1, 1996, 61-84.

Barber, K., et al., "Specshield: Shielding speculative data from microarchitectural covert channels", 28th International Conference on Parallel Architectures and Compilation Techniques (PACT), IEEE, 2019, 151-164.
Bar-El, H., et al., "The sorcerer's apprentice guide to fault attacks", Proceedings of the IEEE, vol. 94, No. 2, 2006, 370-382.
Barenghi, A., et al., "Fault injection attacks on cryptographic devices: Theory, practice, and countermeasures", Proceedings of the IEEE, vol. 100, No. 11, 2012, 3056-3076.
Costan, V., et al., "Sactum: Minimal hardware extensions for strong software isolation", 25th (USENIX) Security Symposium ({USENIX} Security 16), 2016, 857-874.
Kim, J. S., et al., "The DRAM latency PUF: Quickly evaluation physical unclonable functions by exploiting the latency-reliability tradeoff in modem commodity DRAM Devices", 2018 IEEE International Symposium on High Performance Computer Architecture (HPCA), IEEE, 2018, 194-207.
Maxim Integrated, "DS3645: 4KB Secure Memory with Tamper Protecton for Network Server Applications", https://www.maximintegrated.com/en/products/embedded-security/security-amangers/DS3645.html, downloaded Mar. 1, 2021.
Messerges, T. S., et al., "Examning smart-card security under the threat of power analysis attacks", IEEE Transactions on Computers, vol. 51, No. 5, 2002, 541-552.
Quisquater, J. J., et al., "Electromagnetic analysis (ema): Measures and counter-measures for smar cards", International Conference on Research in Smart Cards, Springer, 2001, 200-210.
Altera Corporation, "DDR2, DDR3, and DDR4 SDRAM Board Design Guidelines", https://documents.pub/document/ddr2-ddr3-and-ddr4-sdram-board-design-guidelines-4-ddr3-and-ddr4-sdram-board.html?page=1, Dec. 16, 2013.
Chean, V., et al., "Study of the mechanical behavior of the optical fiber by a mark-tracking method", EPJ Web of Conferences, vol. 6, 2010, 34002-1-8.
Daigneault, M. A., et al., "A high-resolution time-to-digital converter on FPGA using dynamic reconfiguration", IEEE Transactions on Instrumentation and Measurement, vol. 60, No. 6, 2011, 2070-2079.
Dayeol, Lee, et al., "An off-chip attack on hardware enclaves via the memory bus", 29th USENIX Security Symposium, Aug. 12-14, 2020, Virtual Event, 2020.
Favi, C., et al., "A 17ps time-to-digital converter implemented in 65nm technology", Proceedings of the 7th ACM SIGDA International Symposium on Field-Programmable Gate Arrays, FPGA '09, 2009, 113-120.
Gueron, S., "Memory encryption for general-purpose processors", IEEE Security and Privacy, vol. 14, No. 6, 2016, 54-62.
He, H., et al., "Self-mixing demodulation for coherent phase-sensitive OTDR System", Sensors, vol. 16, No. 5, 2016, 1-10.
Hill, K. O., et al., "Fiber Bragg grating technology fundamentals and overview", J. Light. Technol. vol. 15, No. 8, 1997, 1263-1276.
Jia, S., "Doubling up on Fiber Capacity: A Winning Strategy for Full Duplex Coherent Optics", https://www.cablelabs.com/blog/doubling-fiber-capacity-winning-strategy-full-duplex-coherent-optics. Downloaded May 23, 2022, Mar. 8, 2018.
Kaplan, D., et al., "AMD Memory Encryption", White Paper, http://amd-dev.wpengine.netdna-cdn.com/wordpress/media/2013/12/AMD_Memory_Encryption_Whitepaper_v7-Public.pdf, Apr. 21, 2016.
Kleberger, P., et al., "Security aspects of the in-vehicle network in the connected car", IEEE Intelligent Vehicles Symposium Proceedings, IEEE, 2011, 528-533.
Koyamada, Y., et al., "Fiber-optic distributed strain and temperature sensing with very high measurand resolution over long range using coherent OTDR", J. Light. Technol., vol. 27, No. 9, 2009, 1142-1146.
Lalam, N., et al., "Performance Improvement of Brillouin Ring Laser Based BOTDR System Employing a Wavelength Diversity Technique", J. Light. Technol., vol. 36, No. 4, 2018, 1084-1090.
Lee, D., et al., "SNR enhancmenet of OTDR using biorthogonal codes and generalized inverses", IEEE Photonics Technol. Lett., vol. 17. No. 1, 2005, 163-165.

(56) References Cited

OTHER PUBLICATIONS

Li, Q., et al., "High Spatial Resolutation BOTDR Based on Differential Brillouin spectrum Technique", IEEE Photonics Technol. Lett., vol. 28, No. 14, 2016, 1493-1496.

Liehr, S., et al., "Wavelength-scanning coherent OTDR for dynamic high strain resolution sensing", Opt. Express, vol. 26, No. 8, 2018, 10573.

Liu, Y., et al., "Raman distributed temperature sensor with high spatial and temperature resolution using optimized graded-index few-mode fiber over 25 km-long distance", Paper, 26th Annual Conference on Optical Fiber Sensors, Sep. 24-28, 2018, Lausanne, Switzerland, 2018.

Lu, P., et al., "Distributed optical fiber sensing: Review and perspective", Appl. Phys. Rev., vol. 6, No. 4, 2019.

Lunaic, "Optical Backscattering Reflectometry (OBR)—Overview and Applications", Whitepaper downloaded from Lunainc.com, Aug. 17, 2018.

Mauldin, T., et al., "Minimal Overhead Optical Time-domain Reflectometer Via I/O Integrated Data Converter Enabled by Field Programmable Voltage Offset", The International Conference on Field-Programmable Logic and Applications, IEEE, 2021, 160-166.

Moghadas, S. H., et al., "ROPAD: A Fully Digital Predictive Ring Oscillator Probing Attempt Detector", 2020 57th ACM/IEEE Design Automation Conference, 2020, 1-6.

Muanenda, Y., "Recent Advances in Distributed Acoustic Sensing Based on Phase-Sensitive Optical Time Domain Reflectometry", J. Sensors, vol. 2018, 2018.

Oksman, A., "A Method for Detecting DRAM Bus Tampering", Thesis, Aalto University, Espoo, Finland, 2020.

Optical Zonu Corporation , "iSFC(R) Micro-OTDR Transceiver Series Fast Fiber Fault Finder(TM) Product Specification Sheet", Optical Zonu Corporation, 2014.

Park, N., et al., "Coded optical time domain reflectometry: principle and applications", Passive Components Fiber-Based Devices IV, Pro., of SPIE, edited by Li, Ming-Jun, et al., vol. 6781, 2007, 678129-1-12.

Pastor-Graells, J., et al., "Single-shot distributed temperature and strain tracking using direct detection phase-sensitive OTDR with chirped pulses", Opt. Express, vol. 24, No. 12, 2016, 13121-13133.

Pearson, Chris , "Clock Skew in Large Multi-GHz Clock Trees", Analog Dialogue 53-01, 2019.

Sudharani, K., et al., "Studies on Coding Techniques and It's Application to OTDR", Project Report, Department of Electronics & Communication Engineering, National Institute of Technology, Rourkela, India, 2009.

Trikalinou, A., et al., "Taking DMA Attacks to the Next Level", BlackHat USA 2017, Las Vegas, NV, Jul. 22-27, 2017, 2017.

Werner, M., et al., "Transparent memory encryption and authentication", 2017 27th International Conference on Field Programmable Logic and Applications, FPL 2017, IEEE, 2017, 1-6.

Xilinx, "UltraScale Architecture SelectIO Resources User Guide UG571 (v1.5)", Nov. 24, 2015.

Xilinx, "UltraScale Architecture-Based FPGAs Memory IP v1.4 LogiCORE IP Product Guide, Vivado Design Suite", Oct. 22, 2021.

Xilinx, Inc., "Versal Architecture and Product Data Sheet: Overview", https://dokumen.tips/documents/versal-architecture-and-product-data-sheet-overview-ds950-prime-series-the.html?page=1, Downloaded Jun. 13, 2022, Oct. 2, 2018.

Xu, Z., et al., "A Bus Authentication and Anti-Probing Arachitecture Extending Hardware Trusted Computing Base off CPU Chips and beyond", Proceedings—International Symposium on Computer Architecture, 2020, 749-761.

\* cited by examiner

METHODS AND APPARATUSES FOR IDENTIFYING TRANSMISSION LINES VIA IMPEDANCE INHOMOGENEITY PATTERNS

CROSS-REFERENCE TO RELATED APPLICATIONS

This application claims priority to and the benefit of the filing of U.S. Provisional Patent Application No. 62/801,920, entitled "Methods and Apparatus for Identifying Transmission Lines Via Impedance Homogeneity Patterns", filed on Feb. 6, 2019, the specification and claims of which are incorporated herein by reference.

BACKGROUND OF THE INVENTION

Field of the Invention (Technical Field)

The present invention generally relates to impedance inhomogeneity patterns in transmission lines and more particularly to methods and apparatuses for using impedance inhomogeneity patterns to identify transmission lines or discrete sections of transmission lines.

Background Art

Note that the following discussion may refer to a number of publications and references. Discussion of such publications herein is given for more complete background of the scientific principles and is not to be construed as an admission that such publications are prior art for patentability determination purposes.

As used throughout the specification and claims, a "transmission line" (TX-Line) is defined as a device or structure that can transmit and guide electromagnetic energy and signals from one location to another. The energy and signals that travel in transmission lines are in the form of travelling waves. According to the types of supported travelling waves, transmission lines can be broadly categorized into three types. First, electrical transmission lines support and guide the propagation of electromagnetic travelling waves, including radio frequency (RF) waves, microwaves, and millimeter to terahertz waves. Examples of electrical TX-Lines include two-wire lines (e.g., twisted pair) in Ethernet cables or other high speed digital transmission cables, coaxial cables, parallel plate transmission lines, microstrip lines on a printed circuit board (PCB), striplines on a PCB, coplanar waveguides (CPW) on a PCB, metallic or dielectric waveguides, transmission lines on flexible printed circuit (FPC), flexible flat cables (FFC), on-chip transmission lines inside an integrated circuit (IC), high frequency circuit vias, connectors, etc. The combination of any of these, i.e. cascaded electrical transmission lines (e.g. coaxial cable, followed by RF connector, microstrip, via, and stripline can be consider as a cascaded electrical transmission line) can be used for various ID applications. Second, optical transmission lines support the propagation of light waves, i.e. optical travelling waves, most often with a wavelength in the ultraviolet (UV), to visible, to infrared (IR) range. Examples of optical transmission lines include optical fibers, optical strip waveguides on a photonic integrated circuit (PIC), optical rib waveguides on a PIC, segmented optical waveguides, photonic crystal waveguides, plasmonic waveguides, laser-inscribed optical waveguides, light pipes, fiber-to-chip couplers, etc. The combination of them, i.e. cascaded optical transmission lines, can be used for various ID applications. Third, acoustic transmission lines such as acoustic pipes support and guide the propagation of acoustic travelling waves. Cascaded acoustic transmission lines can be used for various ID applications.

Similar to an optical waveguide such as an optical fiber, the characteristic impedance, a fundamental property of any TX-Line, is determined by its unique geometry and material properties. Ideally, the characteristic impedance is constant as a function of distance along the direction of wave propagation in any TX-Line. However, in reality, there exists a small amount of impedance variation as a function of distance along the direction of wave propagation. The inhomogeneity of a transmission line's geometry and/or material properties along the wave propagation results in a varied impedance as a function of location along the direction of wave propagation, defined herein as the impedance inhomogeneity pattern. The intrinsic/inherent impedance inhomogeneity pattern on a coaxial cable can be used for distributed sensing. The impedance inhomogeneity pattern of any transmission line is unique, unpredictable, uncontrollable, and highly random, and therefore can be used as a unique fingerprint of the transmission line, i.e. a physical unclonable function (PUF). The impedance inhomogeneity pattern is unclonable due to its high complexity and high randomness, or in other words, high entropy. The intrinsic impedance inhomogeneity pattern is introduced to a transmission line during its fabrication process.

Reflectometry has been used to detect large magnitude reflections, such as those from a break, kink, or open end, in a transmission line. However, no reflectance method has been used to detect or analyze the technical effect of other, lower magnitude changes to the impedance inhomogeneity pattern of a TX-Line, such as those due to unevenness of material and/or geometry along the direction of wave propagation in the TX-Line. A goal of the present invention is to use the impedance inhomogeneity pattern of a TX-Line to provide a technical solution to the problem of identifying the TX-Line or detecting bending, tapping, bugging, or otherwise tampering in the TX-Line.

SUMMARY OF THE INVENTION (DISCLOSURE OF THE INVENTION)

An embodiment of the present invention is a method for analyzing a transmission line, the method comprising an analog wave generator transmitting a travelling wave through a connector into at least a segment of a transmission line; an analog receiver measuring backscattered wave reflections as a function of distance along a propagation direction of the segment of the transmission line; extracting an impedance inhomogeneity pattern (IIP) from the measured backscattered wave reflection; and comparing the IIP with an intrinsic IIP extracted from the segment of the transmission line prior to first use of the transmission line. The method optionally further comprises concluding that the transmission line has been altered or tampered with if the comparing step comprises determining the IIP is sufficiently different from the intrinsic IIP. The method alternatively further comprises concluding that the transmission line has not been altered or tampered with and/or that segment of the transmission line generated the intrinsic IIP if the comparing step comprises determining the IIP is sufficiently identical to the intrinsic IIP. In the latter case, the method preferably further comprises authenticating the transmission line and/or an article which the transmission line is integrated with, embedded in, or attached to. The method is preferably repeated for a plurality of segments of the transmission line.

The analog wave generator optionally generates a pulse comprising a predetermined waveform, in which case the measuring step preferably comprises directly measuring a back-reflection coefficient as a function of distance using time domain reflectometry. The predetermined waveform preferably comprises a step function or an impulse function. Alternatively the analog wave generator comprises a frequency modulated continuous wave source or a broadband wave source, in which case a vector network analyzer optionally comprises the analog wave generator and analog receiver, or alternatively a microwave interferometer is used to perform homodyne detection. In these cases the extracting step preferably comprises performing an inverse Fourier transform of complex reflection coefficients obtained in the frequency domain over a bandwidth of the wave source in order to perform frequency domain reflectometry.

The segment of the transmission line is preferably selected by using time gating. The comparing step preferably comprises performing a cross correlation. The equal error rate obtained during the comparing step is preferably less than approximately 0.1%, more preferably less than approximately 20 ppm, and even more preferably approximately zero. The comparing step optionally comprises using a coherence function. The results obtained during the comparing step are preferably approximately independent of a temperature of the transmission line and preferably approximately independent of the termination quality of the transmission line. The transmission line is preferably selected from the group consisting of two-wire line, twisted pair Ethernet cable, a high speed digital transmission cable, coaxial cable, parallel plate transmission line, microstrip line on a printed circuit board (PCB), stripline on a PCB, coplanar waveguides (CPW) on a PCB, metallic or dielectric waveguide, transmission line on a flexible printed circuit (FPC), flexible flat cable (FFC), on-chip transmission line inside an integrated circuit (IC), high frequency circuit vias, connector, optical fiber, optical waveguide, optical strip waveguide on a photonic integrated circuit (PIC), optical rib waveguide on a PIC, segmented optical waveguide, photonic crystal waveguide, plasmonic waveguide, laser-inscribed optical waveguide, light pipe, fiber-to-chip coupler, acoustic pipe, and combinations thereof.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Figure 1:
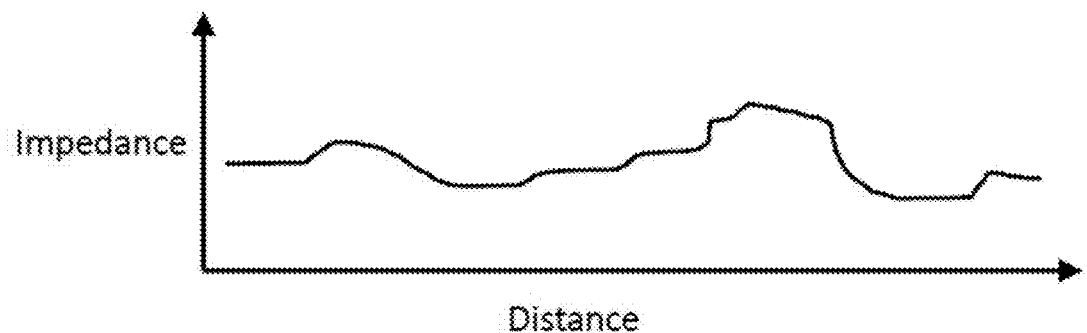
FIG. 1 is the exemplary plot of a random, unique and unclonable impedance inhomogeneity pattern as a function of distance in a transmission line.

The intrinsic impedance inhomogeneity pattern of a transmission line upon manufacture is unique, unpredictable, uncontrollable, unclonable, and fingerprint-like, which can be considered a physical unclonable function (PUF). After manufacture a transmission line can be intentionally modified artificially, or modified as a result of environmental effects, via various physical and chemical processes, such as by modulating the material chemically, for example via etching, modulating the material thermally, for example using a soldering iron or laser, or by mechanically modulating the transmission line, for example by creating a kink in the transmission line by bending or twisting it at one or more locations. Such modifications will typically change the impedance inhomogeneity pattern of the transmission line. The intrinsic impedance inhomogeneity pattern can thus be used as a PUF to identify TX-Lines or discrete sections of TX-Line for identification (ID) and other identification-based applications. Embodiments of the present invention comprise various methods of using impedance inhomogeneity patterns of a transmission line as a physical unclonable function (PUF) for purposes of ID of the transmission line, or objects that include such a transmission line, the entire transmission line or transmission path, or a section of the transmission line, as well as other identification-based applications. Examples include enabling or enhancing physical layer (PHY) communication link security, TX-Line-based sensing security, supply chain security, anti-counterfeiting, manufacturing traceability, etc.

The impedance inhomogeneity pattern can be extracted through the measurement of backscattered reflection waves along the propagation direction of the TX-Line, also known as the reflection coefficient as a function of propagation distance. The reflection coefficient as a function of time/distance can be measured via time domain reflectometry (TDR) technology. TDR equipment includes a pulse generator to send pulse(s) from a connector into an electrical TX-Line, a receiver to collect the back-reflections from the same connector, and a controller/synchronization module. This apparatus directly measures the back-reflection coefficient as a function of distance, i.e. the variation of impedance as a function of time or impedance inhomogeneity pattern (IIP). Alternatively, it can be measured in the frequency domain first and then converted to time/distance domain. The latter approach is known as frequency domain reflectometry (FDR). FDR instrumentation includes a vector network analyzer which contains a frequency modulated continuous wave (FMCW) source, which is able to measure complex reflection coefficients at different frequency points (S11) over a bandwidth, which is thus used to measure S11 corresponding to a specific electrical TX-Line, and a RF/microwave interferometer. The inverse Fourier transform of S11 provides the IIP. In either case, these devices are analog, and the system for extracting the impedance inhomogeneity pattern from various types of transmission lines via either frequency domain measurement or time/distance domain measurement is referred to as an ID scanner.

Once the impedance inhomogeneity pattern is measured, time gating functions can be used to divide the impedance inhomogeneity pattern of a long TX-Line into smaller sections, thereby isolating the impedance inhomogeneity pattern of each section. An advantage of isolating the impedance inhomogeneity pattern is that the PUF information of the target section can be well preserved, and not affected by the impedance inhomogeneity patterns of other parts of the TX-Line or the impedance mismatch at either transmitter end or receiver end. The extracted impedance inhomogeneity pattern from each isolated TX-Line section can be compared and identified via waveform correlation in either the time/distance domain or the frequency domain.

Figure 11A:
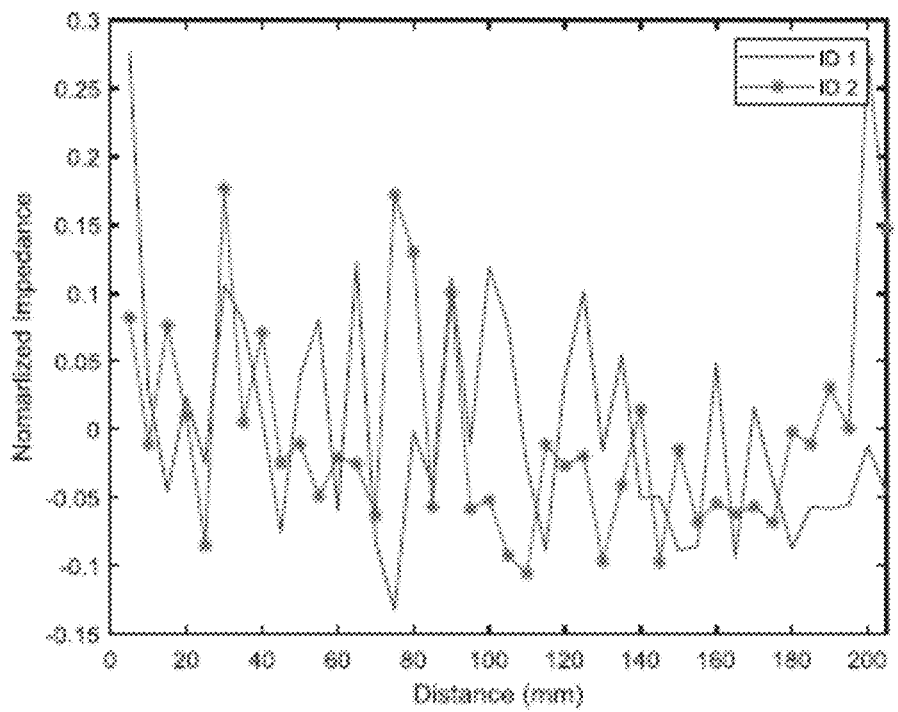
FIG. 11A is a plot of exemplary impedance inhomogeneity patterns of two different equal length (ID1 and ID2) transmission line sections.
Figure 11B:
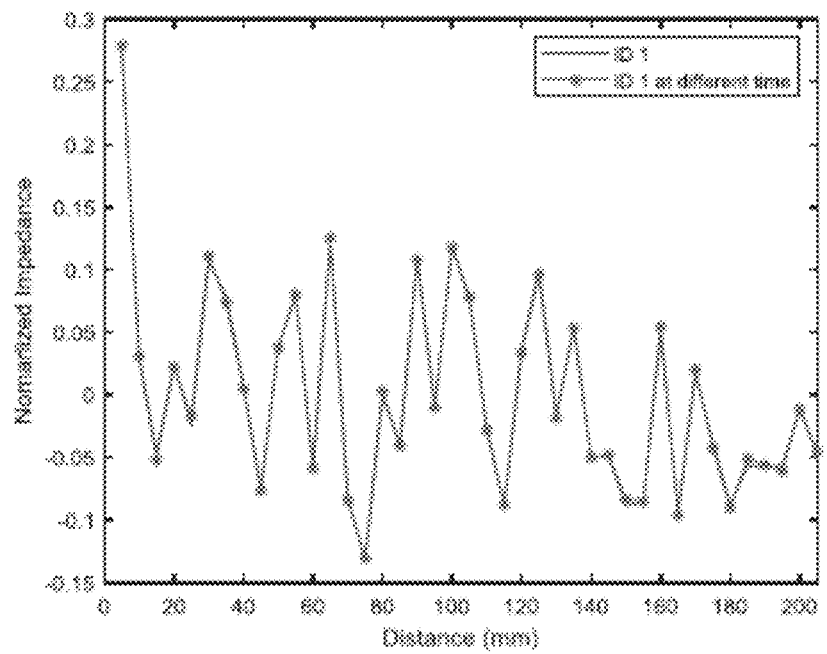
FIG. 11B is a plot of exemplary impedance inhomogeneity patterns of the same transmission line section, extracted at different time points (ID 1 and ID 1 at a different time).

One can identify the target transmission line or a section of the transmission line by evaluating the correlation or coherence between a currently measured inhomogeneity pattern and a previously stored one (see for example FIG. 11B).

Referring now to the drawings, FIG. 1 illustrates a plot of a randomly distributed, unique, and unclonable impedance inhomogeneity pattern as function of distance in a transmission line. The impedance of a transmission line is determined by the material properties and geometry along the propagation direction of the transmission line.

Figure 2:
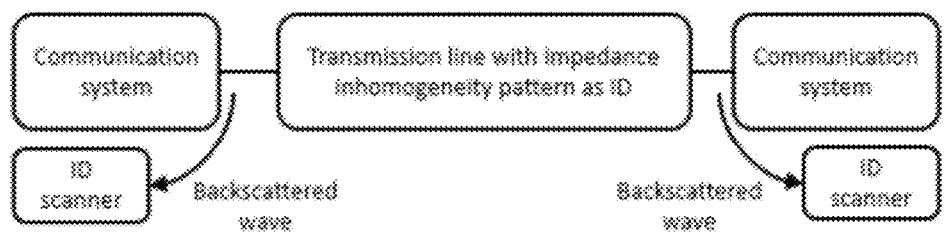
FIG. 2 is an exemplary system architecture using an impedance inhomogeneity pattern as ID to secure communication links.

The impedance patterns of transmission lines can be used to identify communication links to provide a physical layer of protection for communication security. FIG. 2 is an exemplary system architecture using an impedance inhomogeneity pattern as identification (ID) to secure a communication link. As illustrated in FIG. 2, an ID scanner is deployed next to a communication system to collect backscattered waves to extract the ID from the secured transmission line. A base pattern is obtained at the time of installation of the TX-Line and stored for later comparison in a connected database. Any change of the TX-Line from its original state will be detected. The communication system is preferably configured such that it will only send information when the physical layer, i.e. the TX-Line, is secured. For example, a microwave transmission link between two microwave transceivers via the use of a microwave TX-Line can be secured using this method.

Figure 3:
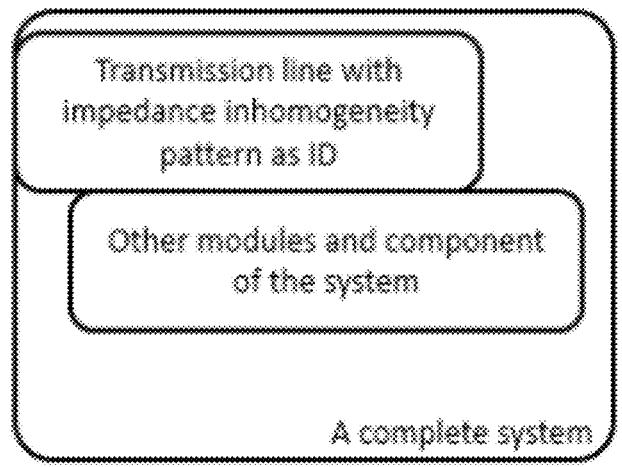
FIG. 3 is an exemplary system architecture using an impedance inhomogeneity pattern as ID to identify a complete system (host of the transmission line).

The impedance pattern of a transmission line can also be used to identify the host of the transmission line for applications including supply chain security, anti-counterfeiting, etc. This type of system is on a smaller physical scale, but the underlying principal is the same. FIG. 3 is an exemplary system architecture using an impedance inhomogeneity pattern as ID to identify a complete system, including other modules and components comprising the complete system. For example, a PCB is the host of a microstrip transmission line, and the impedance inhomogeneity pattern of the microstrip transmission line can be used to identify that particular PCB for supply chain security and anti-counterfeiting applications. The microstrip thus provides that particular printed circuit board (PCB) with a unique identifiable fingerprint for future identification. Another example is that of an optical waveguide on a silicon photonic transceiver PIC chip, which can be used to identify the transceiver.

Figure 4:
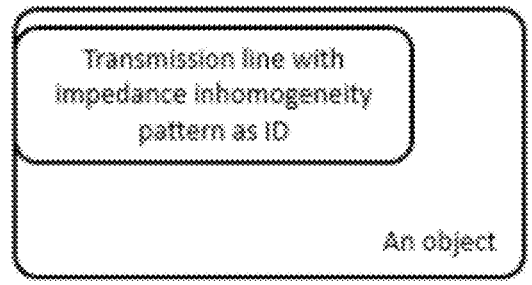
FIG. 4 is an exemplary system architecture using an impedance inhomogeneity pattern as ID to identify an object having an embedded transmission line.
Figure 5:
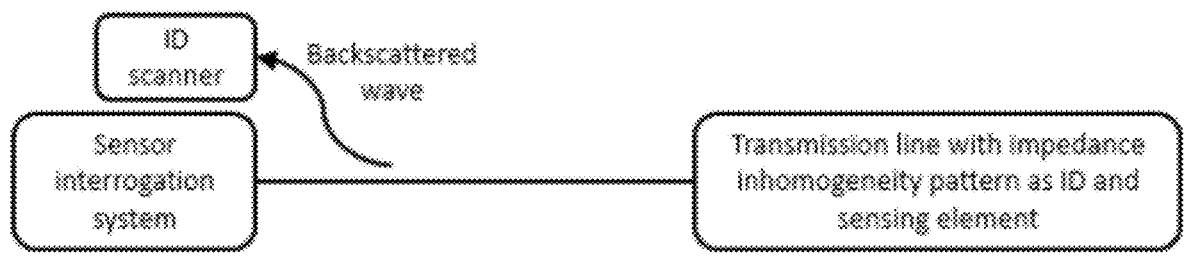
FIG. 5 is an exemplary system architecture using an impedance inhomogeneity pattern as ID and a sensing element simultaneously to secure such sensors and sensing systems.

FIG. 4 is an exemplary system architecture using an impedance inhomogeneity pattern as an ID to identify a discrete object (non-electronic) with an embedded transmission line. For example, a transmission line on a flexible printed circuit (FPC) can be integrated with or embedded in a medicine bottle as an ID tag for individual identification and anti-counterfeiting (similar to RFID tagging). FIG. 5 is an exemplary system architecture using an impedance inhomogeneity pattern as an ID and a sensing element simultaneously to secure sensing data and a sensing system.

Figure 6:
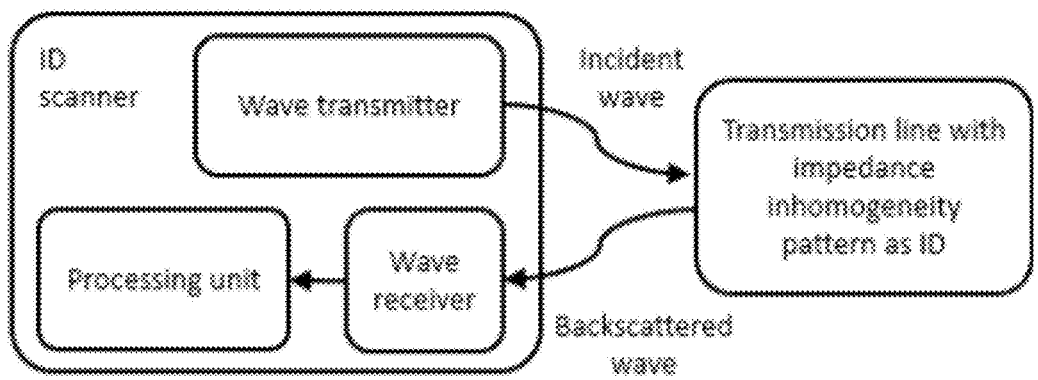
FIG. 6 is an exemplary system architecture of a time domain reflectometry (TDR) based ID scanner to extract impedance inhomogeneity pattern for ID applications.
Figure 7:
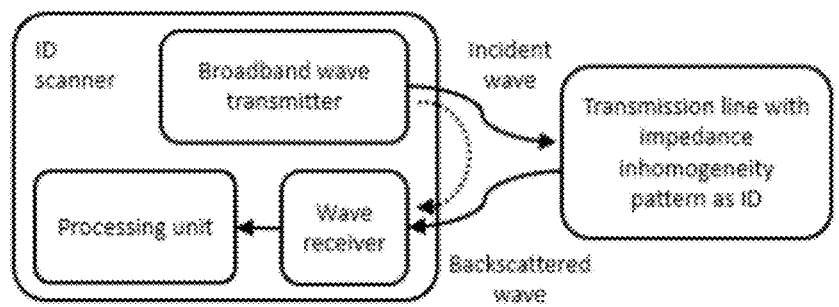
FIG. 7 is an exemplary system architecture of a frequency domain reflectometry (FDR) based ID scanner to extract impedance inhomogeneity patterns for ID applications. The dotted arrow pointing from the broadband wave transmitter to wave receiver represents a local oscillator path, indicating the homodyne/interferometry-type of measurement configuration, which is optional in an FDR based ID scanner.

The impedance inhomogeneity pattern can be extracted through the measurement of backscattered reflection waves along the propagation direction of the transmission line, also known as the reflection coefficient as a function of propagation distance. FIG. 6 is an exemplary system architecture using time domain reflectometry (TDR) in an ID scanner to extract the impedance inhomogeneity pattern in a transmission line. In this ID scanner, the wave transmitter launches incident waves with a predetermined waveform, such as an impulse function or a step function, into the transmission line. The backscattered wave is collected for the ID scanner to extract the impedance inhomogeneity pattern. A processing unit is required to process the data and compare the newly measured ID information with previous stored ones.

Alternatively, the impedance inhomogeneity pattern can be measured via a frequency domain reflectometry (FDR)-based ID scanner. A wave transmitter launches continuous wave (CW) travelling waves, using either a broadband source (e.g., noise source or digital clock generator for electrical transmission ID) or frequency/wavelength-swept source (e.g. voltage controlled oscillator or RF synthesizer for an electrical transmission line), into the transmission line. The backscattered wave is collected and processed to extract the impedance inhomogeneity pattern of the transmission line under test. It is worth noting that a local oscillator (LO), which is a signal path that taps a fraction of the launched wave into the receiver to be mixed with the backscattered wave, can be added into this configuration to provide homodyne/interferometry-based frequency domain measurement capability. In addition, in-phase (I) and quadrature (Q) receivers can be used to provide complex signal measurement with better signal-to-noise ratio (SNR). However, a single channel (i.e., either I or Q channel) can also be used.

Figure 8:
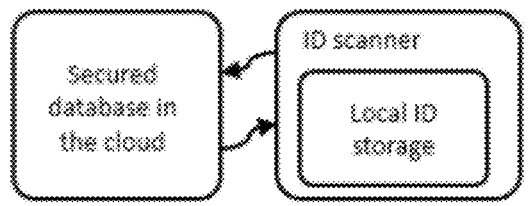
FIG. 8 is an exemplary system architecture of ID storage methods, including cloud storage, local storage, and hybrid cloud-local storage.

FIG. 8 is an exemplary system architecture of ID storage of previously measured patterns. During a registration process, ID patterns are measured and can be stored in a secured database in the cloud, stored on a local memory, or stored in a hybrid fashion.

Figure 9:
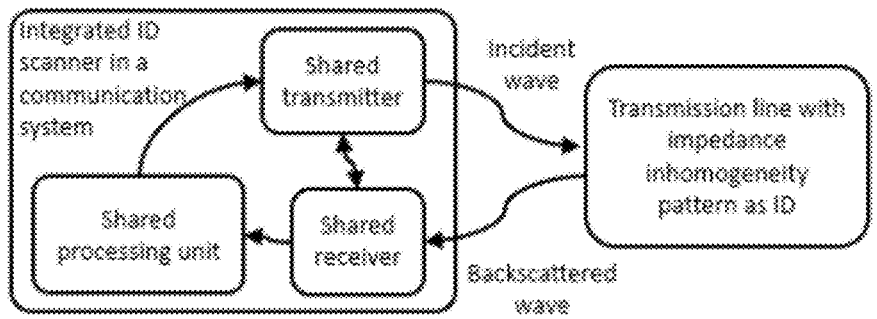
FIG. 9 is an exemplary system architecture of an integrated ID scanner in a communication system with shared modules.
Figure 10:
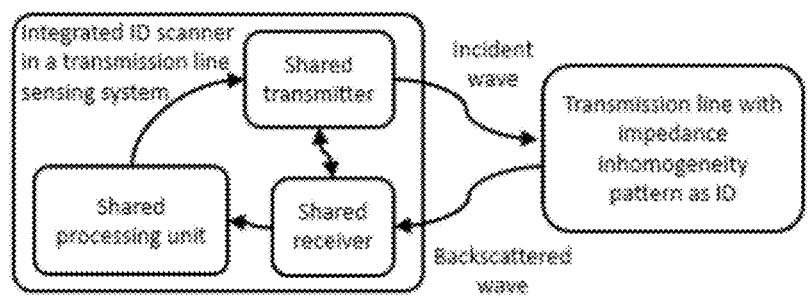
FIG. 10 is an exemplary system architecture of an integrated ID scanner in a transmission line sensing system with shared modules.

FIG. 9 is an exemplary system architecture of an integrated ID scanner in a communication system. FIG. 10 is an exemplary system architecture of an integrated ID scanner in a transmission line-based sensing system. In these combined systems, all common components, such as the transmitter and receiver, can be shared, leading to a reduced system cost. Although the ID scanner equipment can be integrated in other systems, it can also be a standalone instrument.

Figure 11C:
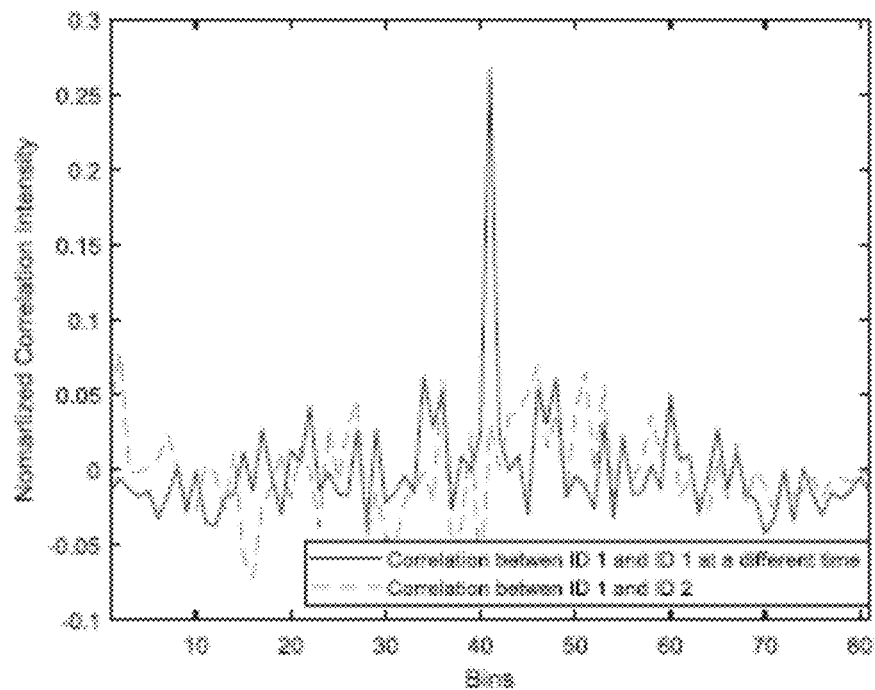
FIG. 11C is an exemplary plot of the cross-correlation results between ID 1 and ID 1 at a different time, and the cross-correlation results between ID 1 and ID 2.

The impedance inhomogeneity pattern can be used for identification by evaluating the correlation or coherence between the newly measured ID and the previously stored one in either the time/distance domain or the frequency domain. FIGS. 11A-11O are the exemplary plots of the signal processing of the transmission line ID technology of the present invention. FIG. 11A is a plot of exemplary impedance inhomogeneity patterns of two different but equal length (ID 1 and ID 2) transmission line sections. The difference between the inhomogeneity impedance patterns is clearly seen. FIG. 11B is a plot of exemplary impedance inhomogeneity patterns of the same transmission line section, extracted at different time points (ID 1 and ID 1 at a different time). The pattern is the same, thus providing the ability to identify the transmission line or to confirm that the transmission line has not been physically tampered with. FIG. 11C is a plot of exemplary cross-correlation results between ID 1 and ID 1 at a different time, and the cross-correlation results between ID 1 and ID 2. FIGS. 11A-11O clearly show that the correlation functions can be used to compare the two IDs for this instant invention. It is worth noting that the impedance inhomogeneity pattern in its frequency domain can also be used. Additionally, it is worth noting that the coherence function can also be used.

While a piece or the entire length of transmission line can be used for the ID application, the impedance inhomogeneity pattern in a transmission line can be segmented into smaller transmission line sections as a function of distance. Both the unique inhomogeneity pattern and the location information of each transmission line section can be used for identification. Using the impedance inhomogeneity pattern from multiple transmission lines in a system can be used to provide enhanced system-level security.

Figure 12:
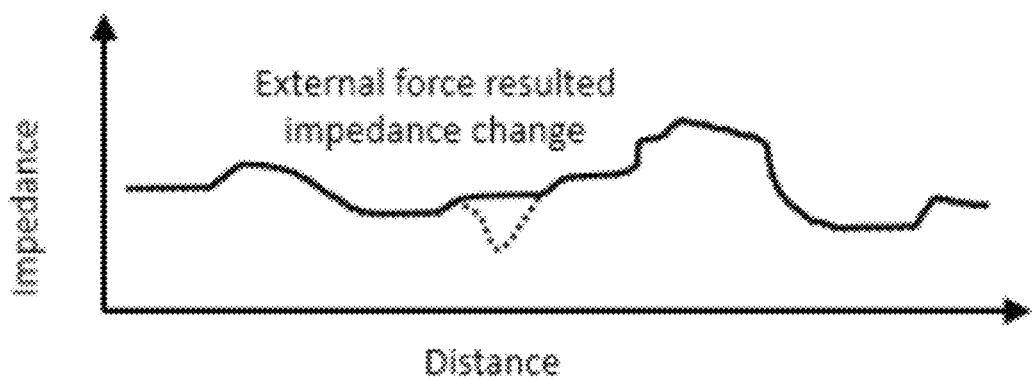
FIG. 12 is an exemplary plot showing the use of transmission line identification technology for simultaneous identification and tamper and/or snooping detection.

In FIG. 12 it can be seen that an external force applied to the transmission line leads to a change of its inhomogeneity pattern, resulting in a weakened or phase shifted coherence spectrum, which can be used for simultaneous identification and tamper and/or snooping detection. FIG. 12 is an exemplary plot showing the use of transmission line ID technology for simultaneous identification and tamper and/or snooping detection.

EXAMPLE

Figure 13:
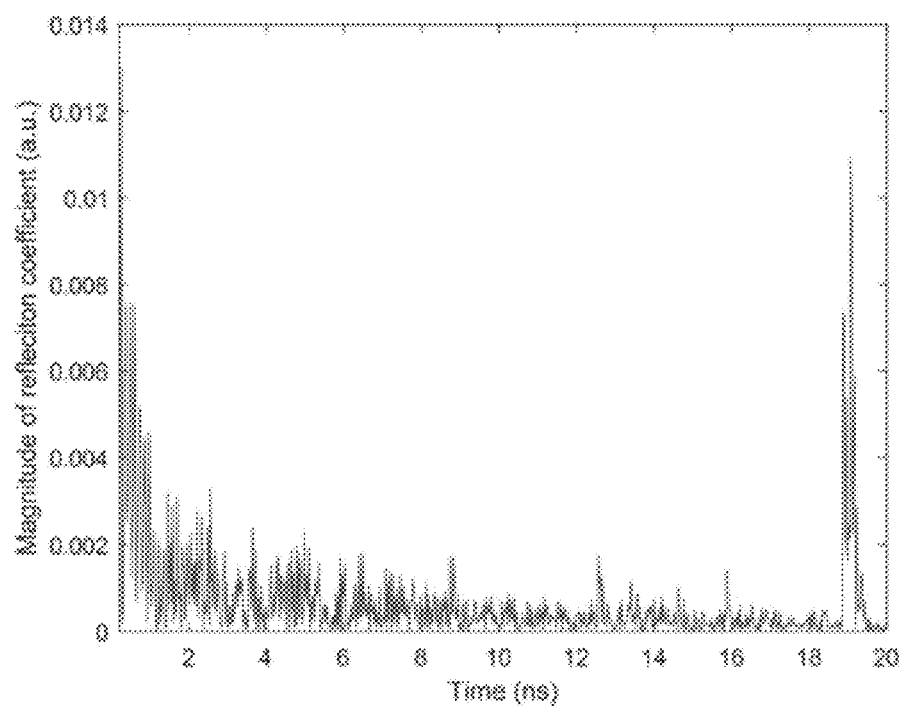
FIG. 13 shows reflection coefficient magnitude as a function of time from a 2 m-long coaxial cable.

A vector network analyzer (VNA) was employed to measure the impedance inhomogeneity pattern of a coaxial cable with a length of 2 m. The bandwidth of the VNA was set from 300 kHz to 20 GHz with a total number of sampling points of 501. The cable under test was terminated using a 50 ohm cap. An inverse Fourier Transform function was applied to the frequency domain reflection coefficient data to achieve the time domain reflection coefficient data. The reflection coefficient magnitude as a function of time of the entire cable was plotted in FIG. 13. As shown in FIG. 13, the termination of the cable resulted in a small reflection at the end of the cable, which occurred at about 19.5 ns in FIG. 13. Given that the velocity of the travelling wave in the cable is about two thirds of the speed of light in vacuum, the measured data matches the expectation.

Ten 10 cm sections were selected from the 2 m long coaxial cable. The normalized impedance inhomogeneity pattern of each section is used as a PUF. Let $X^{(P)}$ represent the PUF being extracted from the object to be identified, and $X^{(D)}$ represent the PUF from the database, where $$\begin{cases} X^{(D)} = (X^{(D)}[0]\ X^{(D)}[1]\ \ldots\ X^{(D)}[N-1])^T \\ X^{(P)} = (X^{(P)}[0]\ X^{(P)}[1]\ \ldots\ X^{(P)}[N-1])^T \end{cases} \quad (1)$$

Note that the length of a PUF (N) depends on the length of the TX-Line used by the system. For a specific system, the length is fixed; thus, N, the length of data in each section, is a constant. The length of each section in this example is 10 cm, corresponding to an N of 40 for each section. Cross-correlation was employed to assess the similarity of two PUFs in the proof-of-concept experiment, which can be expressed as:

$$(X^{(P)} * X^{(D)})[m] = \sum_{k=0}^{N-1} X^{*(P)}[k] * X^{(D)}[k+m] \quad (2)$$

where m=−N+1, −N+2, . . . N−2, N−1. The similarity, denoted by S, is defined to be the peak value of cross-correlation:

$$S = \max_m (X^{(P)} * X^{(D)})[m] \quad (3)$$

Figure 14:
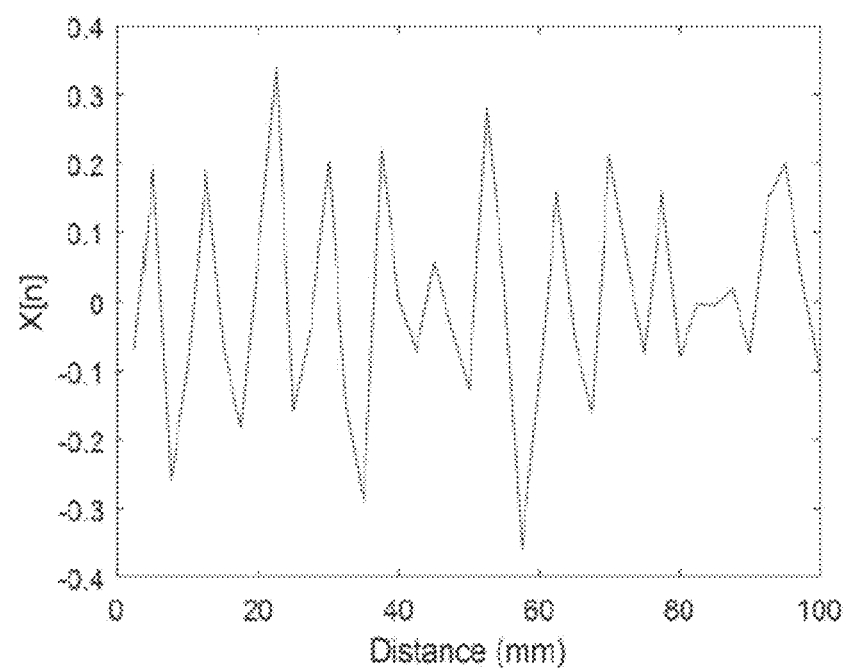
FIG. 14 is an example of TX-Line PUF in database.
Figure 15:
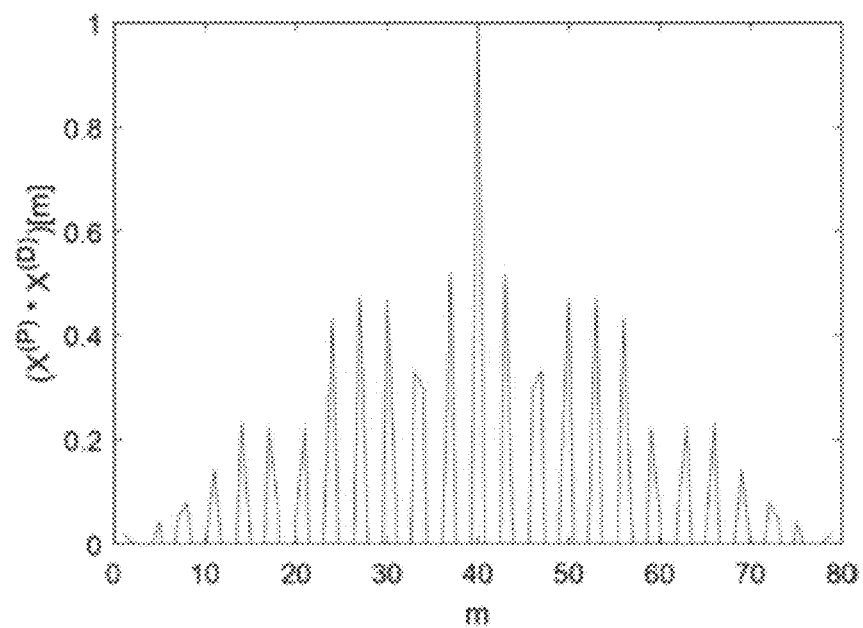
FIG. 15 shows an example of genuine cross-correlation.
Figure 16:
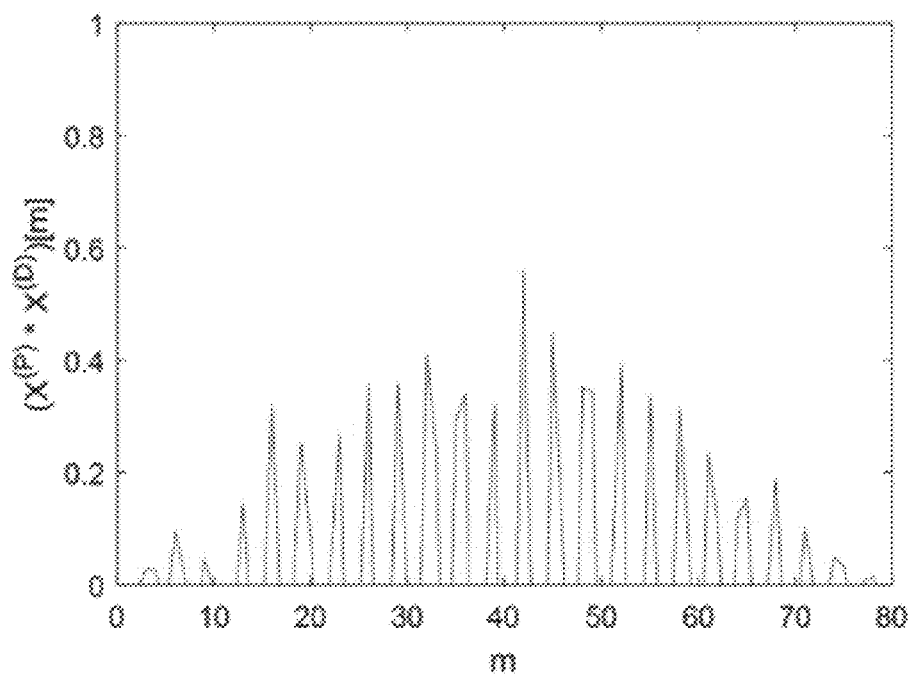
FIG. 16 shows an example of impostor cross-correlation.

FIG. 14 shows a typical PUF from the database. A genuine cross-correlation and an impostor cross-correlation are shown in FIG. 15 and FIG. 16, respectively. In the process of verification, only one match is preferred, determined by a hypothesis test:

$$\begin{cases} H_0 : X^{(P)} \text{ and } X^{(D)} \text{ are from different } PUFs \\ H_1 : X^{(P)} \text{ and } X^{(D)} \text{ are from the same } PUFs \end{cases} \quad (4)$$

where $H_0$ outputs "No", and $H_1$ outputs "Yes".

To quantify the verification accuracy, the 10 independent PUFs (10 cm each) selected from the 2 m-long coaxial cable were studied. The PUF was extracted 5,000 times from each cable section. In total, 50,000 PUFs were collected. In order to study the genuine distribution $P(S|H_1)$, one PUF was randomly selected out of the 5,000 extractions from each independent cable section, and stored as the database PUF. In total, 4999×10 genuine-matching scores were collected. For the distribution $P(S|H_0)$, the same database PUFs were used. For each section, 4,999 PUFs from the other 9 cable sections (TX-Line PUFs) were randomly selected for comparison against the corresponding database PUF. As a result, 4999×9 impostor matching scores were collected.

Figure 17:
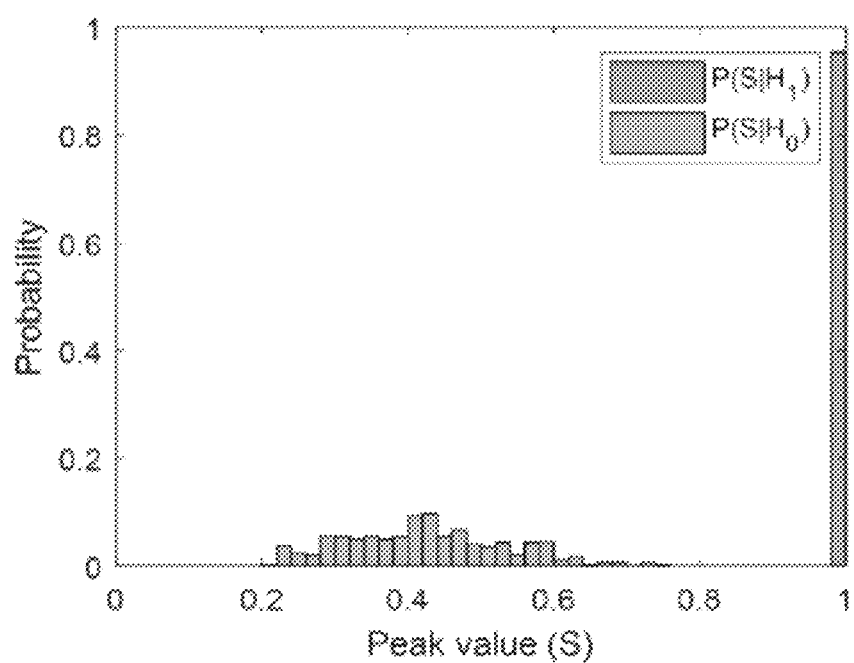
FIG. 17 shows genuine and impostor distributions for a 10 cm TX-Line PUF.

FIG. 17 shows both the genuine and impostor distributions. The x-axis is the similarity evaluation, which is the peak value (S) of the cross-correlation and the y-axis is the probability. Discrimination is sufficiently clear for high-performance verification. The equal error rate (EER), which is the error rate when the threshold is set to the False Alarm Rate equal to one minus Detection Rate, was used as the metric to evaluate the performance of this 10 cm coaxial cable PUF. EER is 0 out of all the samples (50,000 samples) collected. In other words, the EER of this experiment was smaller than 20 ppm.

Performance Evaluation with Different Lengths

Figure 18A:
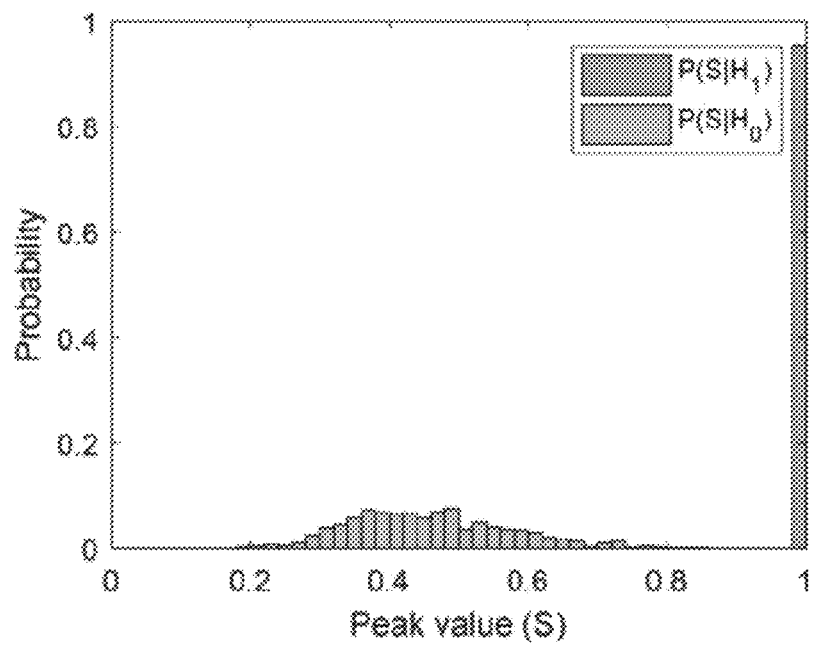
FIG. 18A shows genuine and impostor distributions for a 5 cm PUF length.
Figure 18B:
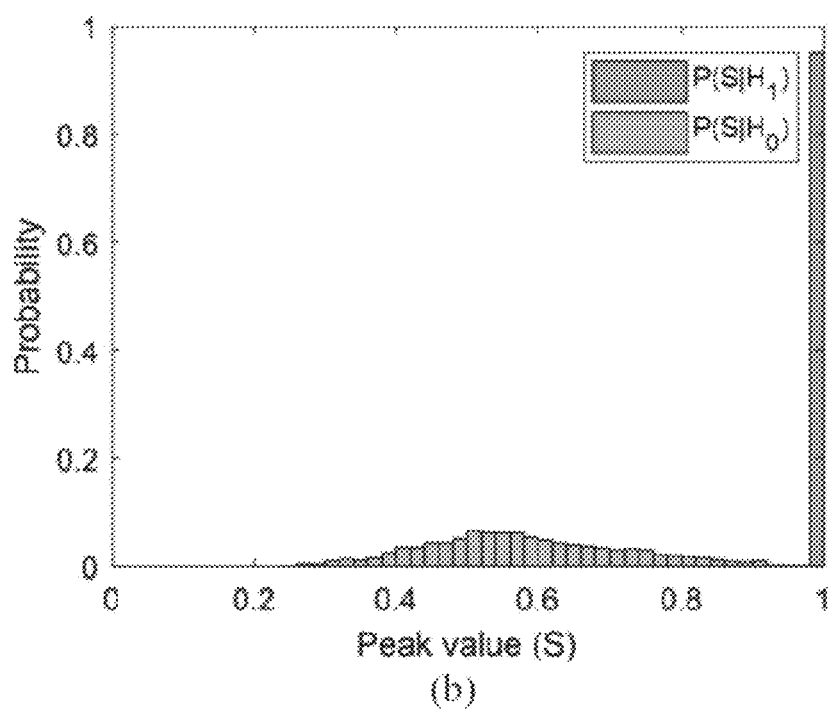
FIG. 18B shows genuine and impostor distributions for a 2 cm PUF lengths.

Cable PUFs with lengths of 5 cm and 2 cm were studied. At each length, 5,000 impedance inhomogeneity patterns were extracted from 20 samples. The results are shown in FIGS. 18A-B. No false alarm was detected on the 5 cm TX-Line PUF verification, shown in FIG. 18A, indicating that the EER of the 5 cm TX-Line PUF is still below 20 ppm. When shrinking the PUF length to 2 cm, genuine and impostor distribution starts to overlap, shown in FIG. 18B. The EER was calculated to be about 0.1%.

Performance Evaluation With Different Bandwidths

Figure 19A:
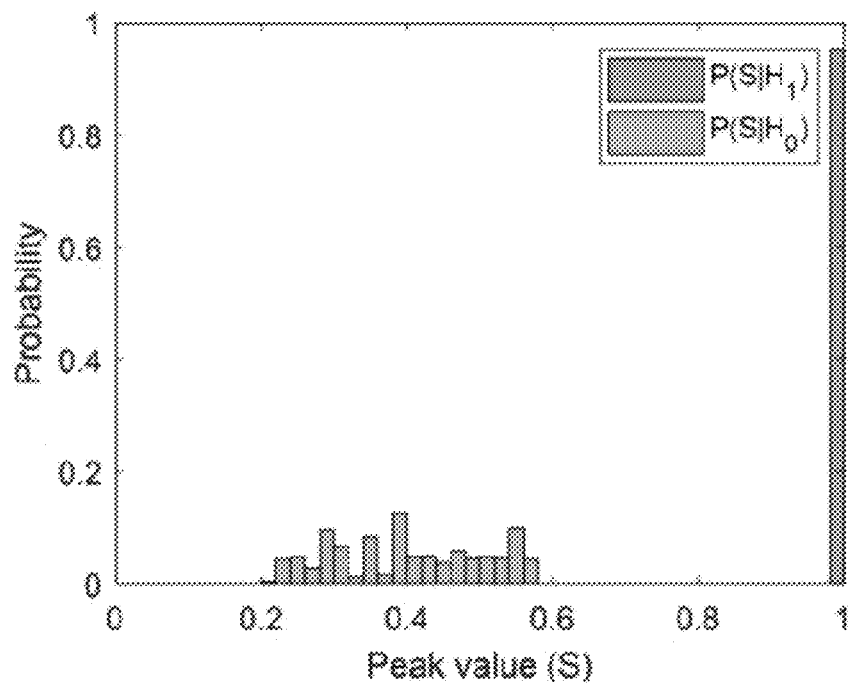
FIG. 19A shows genuine and impostor distributions for a 20 cm TX-Line PUF with a 20 GHz bandwidth.
Figure 19B:
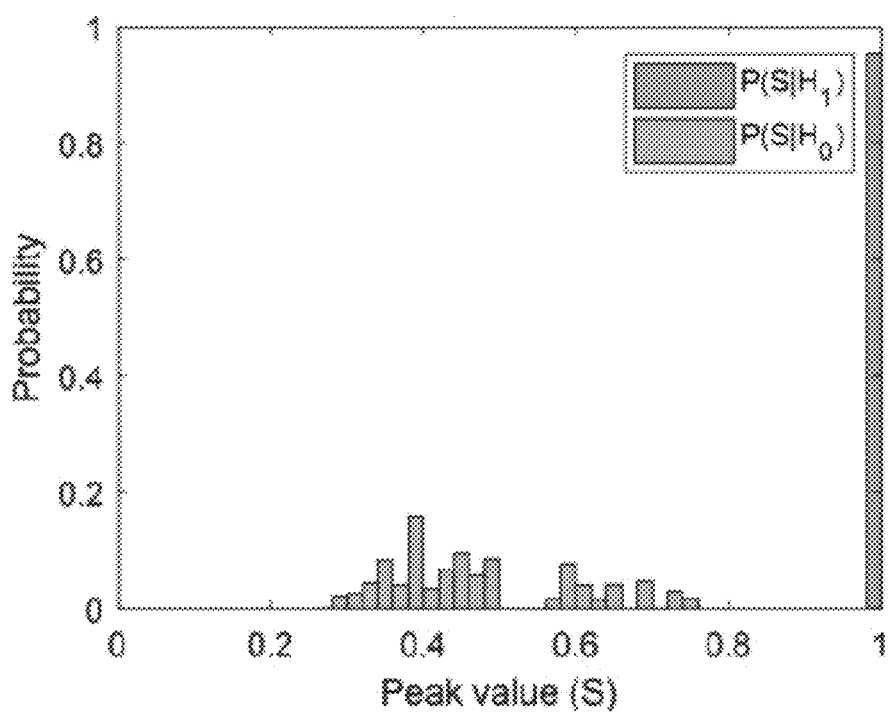
FIG. 19B shows genuine and impostor distributions for a 20 cm TX-Line PUF with a 5 GHz bandwidth.
Figure 19C:
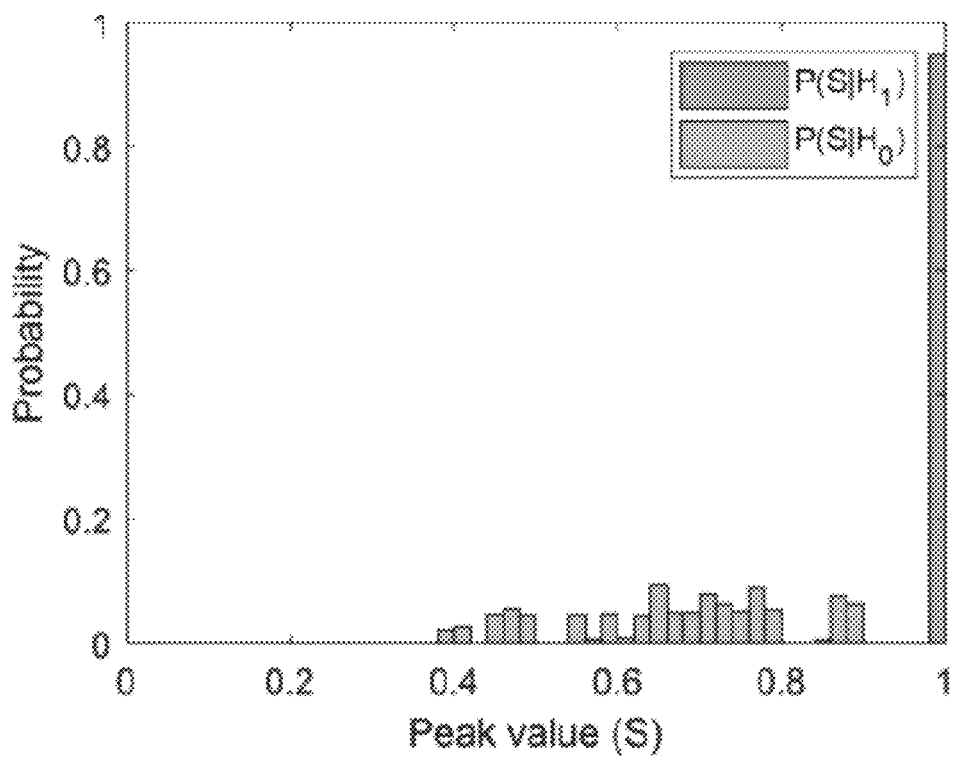
FIG. 19C shows genuine and impostor distributions for a 20 cm TX-Line PUF with a 1.25 GHz bandwidth.

Cables with lengths of 20 cm were measured using different bandwidths of 20 GHz, 5 GHz, and 1.25 GHz, respectively. 5000 impedance inhomogeneity patterns were extracted from all 10 samples. The results are shown in FIGS. 19A-19C respectively. No false alarm was detected for all the measurements. However, as the bandwidth decreases, the genuine and impostor distributions move closer, indicating a decreased PUF verification performance.

Performance Evaluation at Different Temperatures

Figure 20:
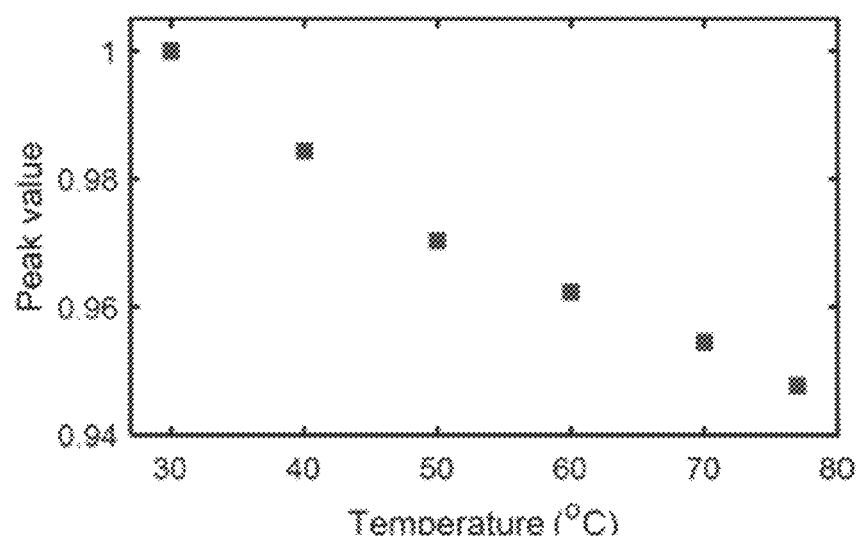
FIG. 20 shows correlation peak as a function of temperature.

The intrinsic impedance inhomogeneity pattern is a fundamental property of a TX-Line. Under the influence of temperature change, the impedance inhomogeneity pattern can change. The external temperature change mainly imposes a phase shift to the pattern. In order to evaluate the influence of temperature change on PUF, the cable used in FIG. 17 was deployed in an oven. A PUF of 10 cm was taken and stored at room temperature, then PUF information from the same sample was extracted and evaluated at temperatures up to 78° C. The correlation peak value as a function of temperature is plotted in FIG. 20. It clearly shows that the correlation of the intrinsic impedance inhomogeneity pattern is not significantly affected by the temperature change.

Performance Evaluation at Different Locations Along the TX-Line

Figure 21A:
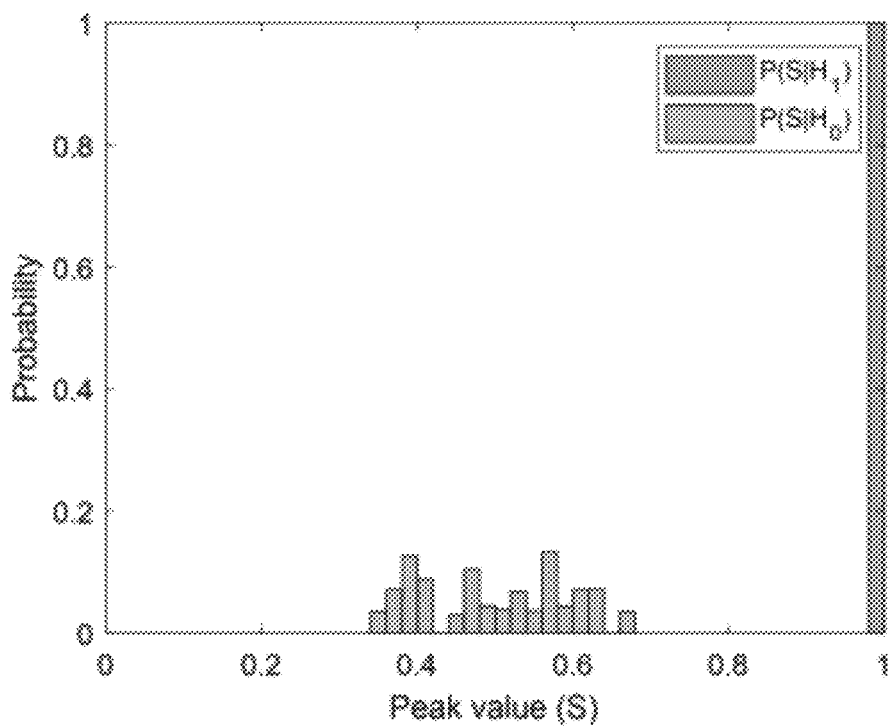
FIG. 21A shows genuine and impostor distributions within the first half of a 2 m cable of a TX-Line (5 cm TX-Line PUF).
Figure 21B:
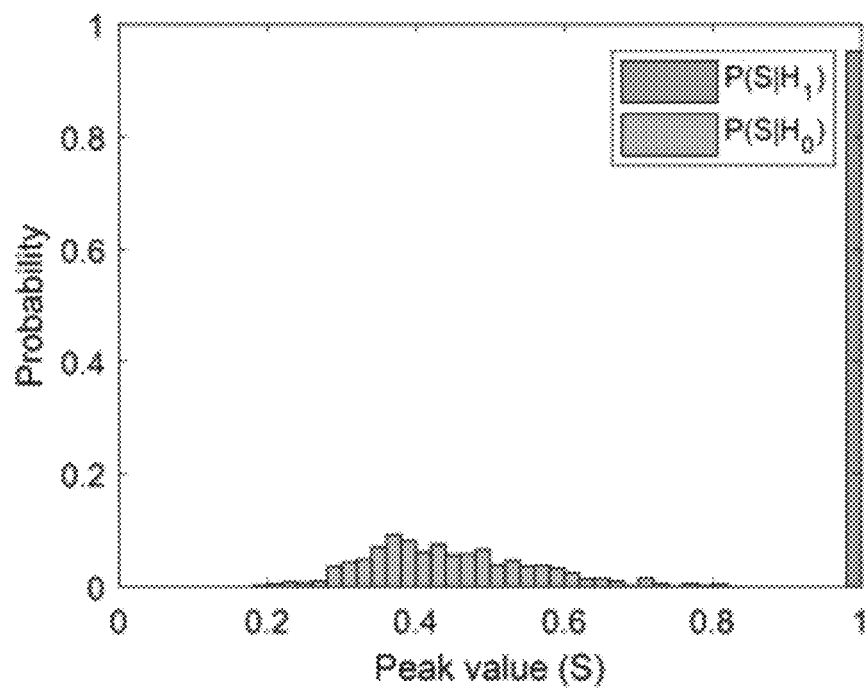
FIG. 21B shows genuine and impostor distributions within the second half of the 2 m cable.

Any TX-Line can be considered as a low pass filter. It strips off higher frequency components as the wave propagates along the line. Since the verification performance is frequency dependent, as shown in FIG. 19, the PUF performance is expected to drop as it moves away from the source of the signal generator. In this experiment, the 2 m cable used in previous tests was virtually divided into two 1 m cables. Within each half of the cable, 10 samples with an equivalent length of 5 cm each were selected. Each sample was measured 5,000 times at a bandwidth of 20 GHz. FIGS. 21A and 21B compare the results within the first and the second half of the cable, respectively. It clearly shows that the PUF performance is better within the first half of the cable.

Using the Coherence Function to Compare TX-Line PUFs

Figure 22A:
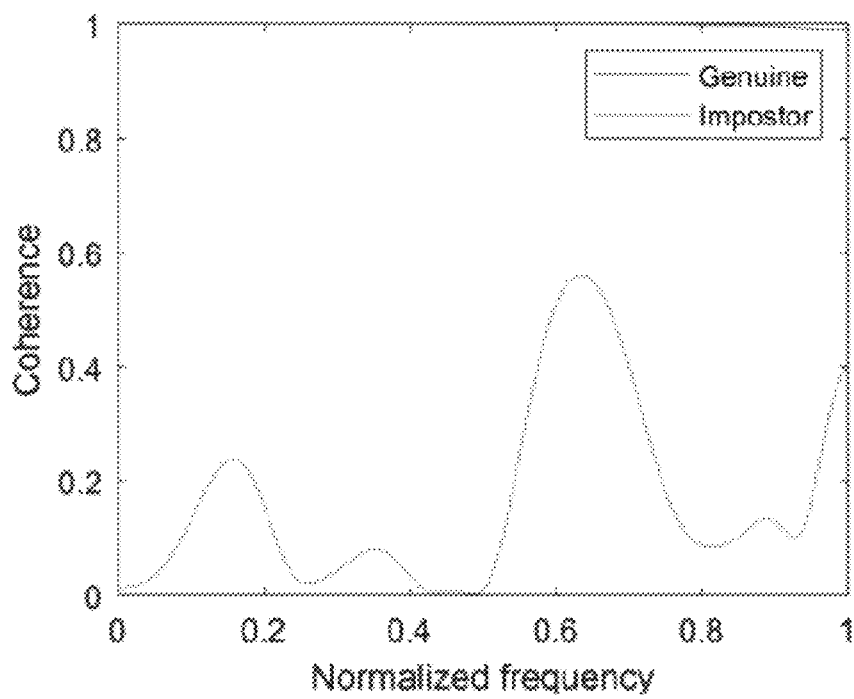
FIG. 22A shows coherence examples for the coherence function of a 10 cm TX-Line PUF.
Figure 22B:
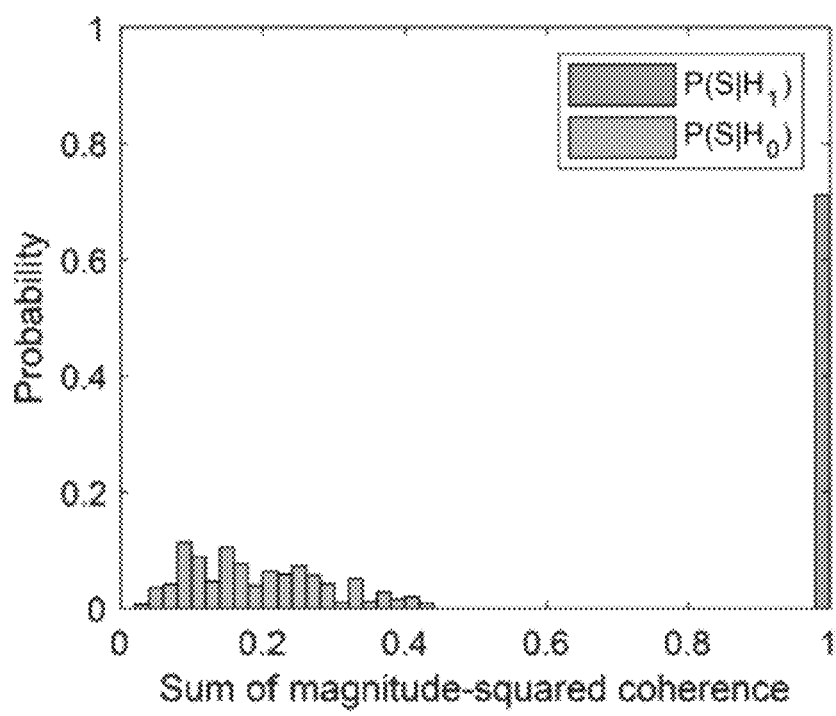
FIG. 22B shows genuine and impostor distributions of a 10 cm TX-Line PUF.

Coherence is another well-known technique to compare the similarity of two waveforms. The coherence function assesses "similarity" by looking at the similarity for two variables in frequency space, rather than time/distance space. The magnitude-squared coherence as a function of normalized frequency for a genuine PUF pair and an impostor PUF pair are shown in FIG. 22A. The summation of the coherence spectrum was used as the score to evaluate the similarity of PUF pairs. Using the data from FIG. 17, the distribution of genuine and impostor score was plotted in FIG. 22B. Similar PUF performance was achieved using the coherence function method.

Termination Influence on the PUF Performance

Figure 23A:
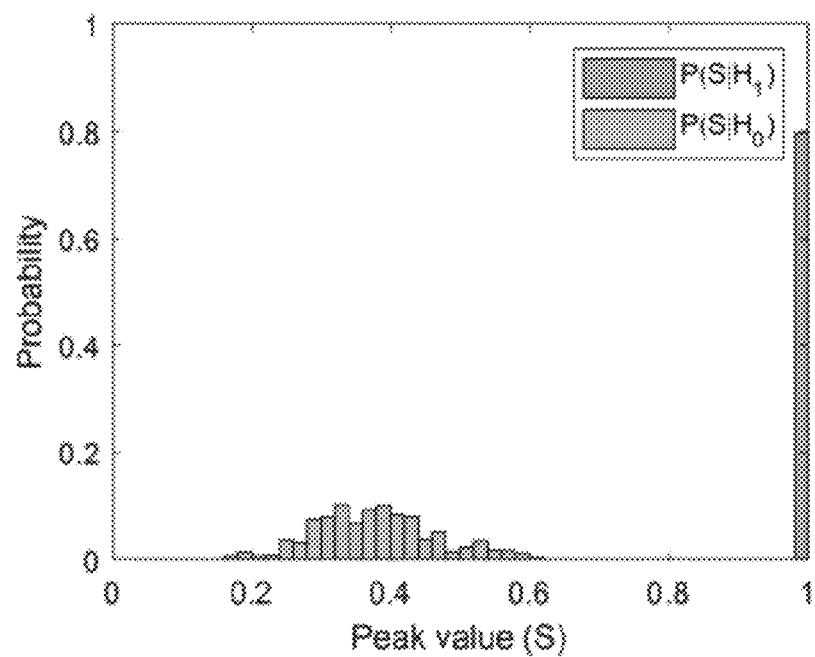
FIG. 23A shows genuine and impostor distributions with short termination (10 cm TX-Line PUF).
Figure 23B:
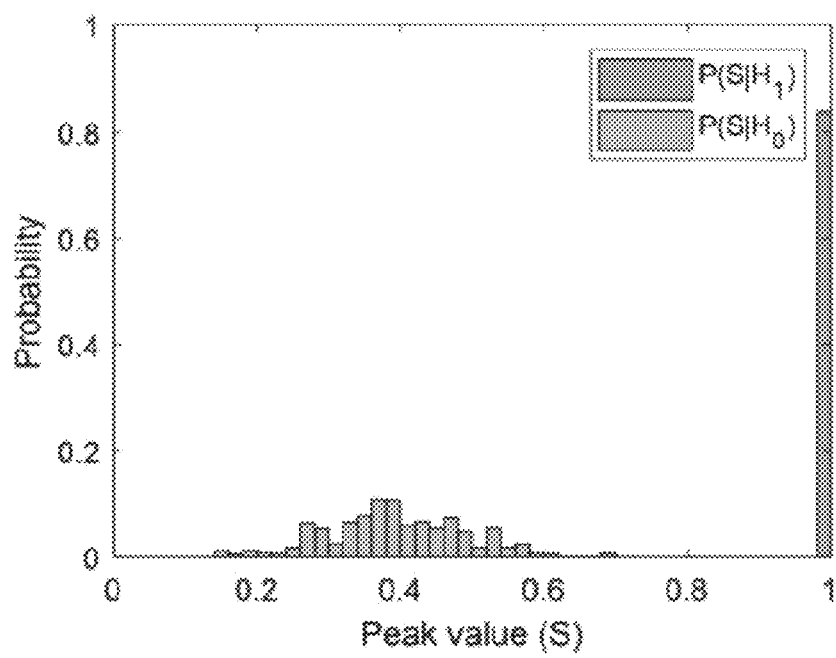
FIG. 23B shows genuine and impostor distributions with open termination (10 cm TX-Line PUF).

Poorly terminated transmission line results in strong reflection at the termination. In order to show the influence of poor terminations, the experiment shown in FIG. 17 was repeated with a short load and an open load. The results are shown in FIG. 23. The poor terminations have almost no influence on the TX-Line PUF performance.

Extracting PUF Using a Homodyne Detection Instrument

Figure 24:
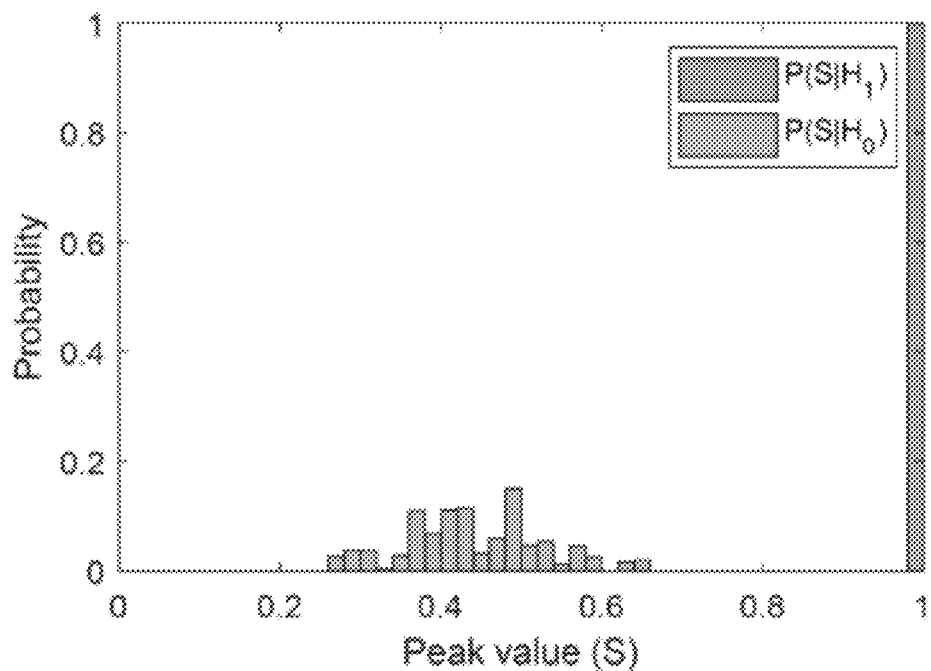
FIG. 24 shows genuine and impostor distributions using the homodyne detection method (1 cm TX-Line PUF).

The intrinsic impedance inhomogeneity pattern can be extracted using a microwave interferometer in a process known as homodyne detection. This approach is widely used in all frequency-modulated continuous-wave (FMCW) radar devices. In this experiment, only the in-phase (I) signal was used for impedance inhomogeneity pattern extraction. The bandwidth of the homodyne detection circuit was 8 to 18 GHz, mainly limited by the bandwidth of the circulator used in this design. The same 2 m-long coaxial cable was used to demonstrate the method's feasibility. As shown in FIG. 24, the homodyne method is equally as good as using a VNA, indicating that FDR-based TX-Line PUF technology can be implemented at a lower cost.

Two Wire TX-Lines

Figure 25:
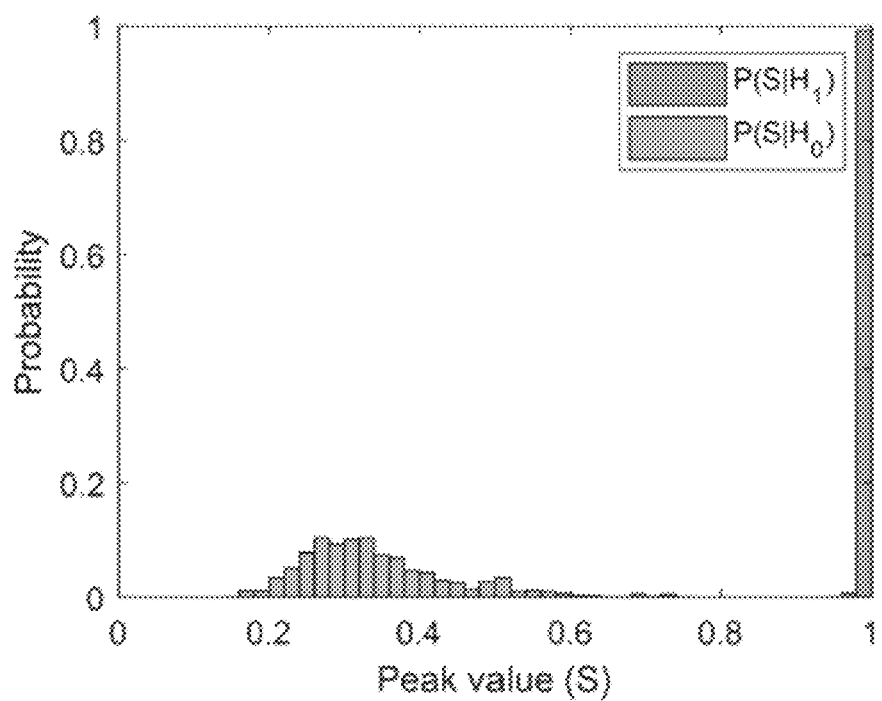
FIG. 25 shows genuine and impostor distributions of twisted pair TX-Line PUFs (10 cm TX-Line PUF).

In order to demonstrate the feasibility of another type of TX-Line, a twisted pair cable was studied. The TX-Line under test was a different pair in a shielded twisted pair (STP) category 7 (CAT7) Ethernet cable. To compare an Ethernet cable PUF with the coaxial cable PUF, the length of the Ethernet cable under test was 2 m. 10 TX-Line PUFs with a length of 10 cm were extracted for 5,000 times, the same as the coaxial cable experiment shown in FIG. 17. The genuine and impostor distributions are shown in FIG. 25. The twisted pair TX-Line PUF performance was similar to that of a coaxial cable. Because two wire TX-Lines are widely used in high-speed digital communication cables, such as HDMI cables, USB cables, PCIe cables, etc., this technology could be potentially adopted for many identification-enabled physical layer (PHY) communication security applications.

Time Domain Measurement Approach

Figure 26A:
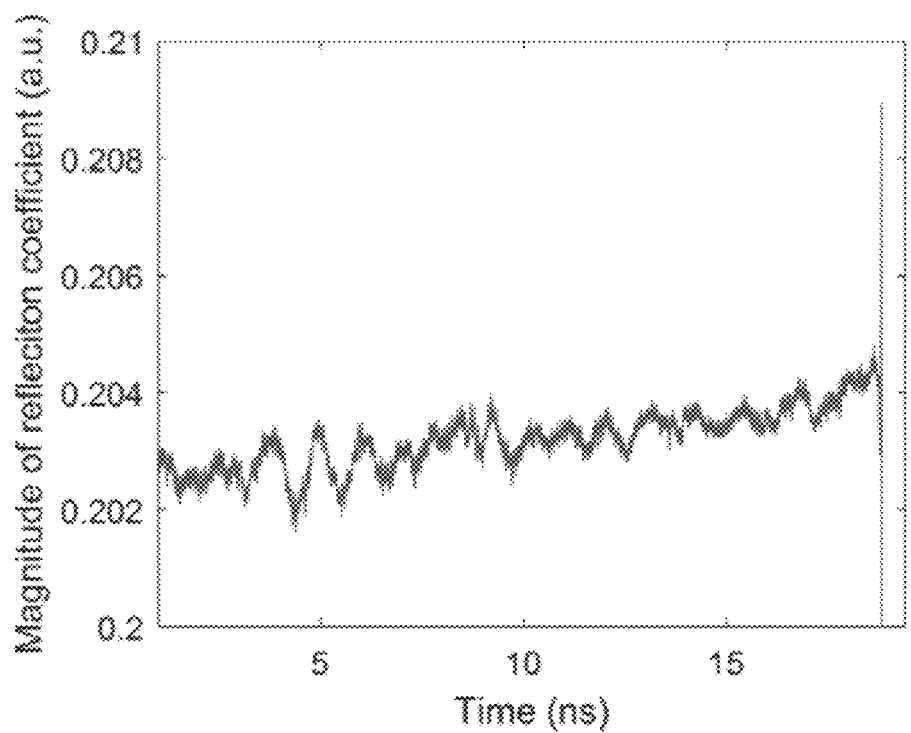
FIG. 26A shows the intrinsic impedance inhomogeneity pattern from a backscattered TDR signal (10 cm TX-Line PUF).
Figure 26B:
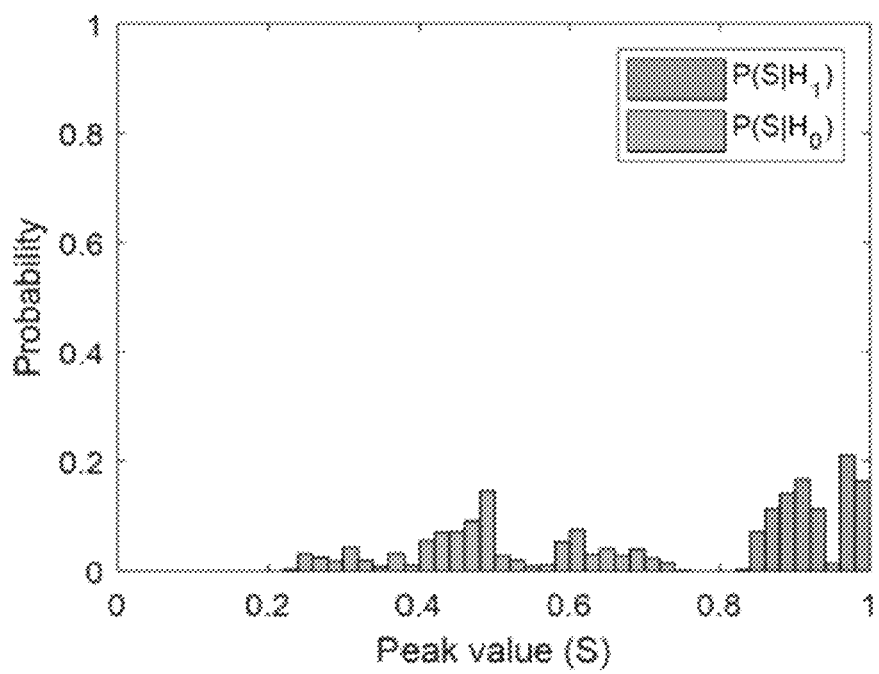
FIG. 26B shows genuine and impostor distributions obtained using the TDR of FIG. 26A.

To demonstrate the feasibility of the TDR-based method to extract an intrinsic impedance inhomogeneity pattern a 2 m-long coaxial cable was studied using a standard TDR instrument based on the classic equivalent time sampling (ETS) method. The ETS sampling rate was 50 GSPS. The backscattered signal, or reflection coefficient against time/distance, was extracted, which is a direct way to measure its intrinsic impedance inhomogeneity pattern, is shown in FIG. 26A. 10 TX-Line PUFs with a length of 10 cm were extracted for 5,000 times, which matches the experiment shown in FIG. 17 for comparison. The genuine and impostor distributions are shown in FIG. 26B. This experiment indicates that the TX-Line PUF performance using the TDR-based method was not as good as the FDR-based method. However, no false alarm was detected over all the comparisons, meaning that the EER is still below 20 ppm, suggesting that the TDR-based method can be used for TX-Line PUF extraction.

To summarize, using a new PUF consisting of the intrinsic impedance inhomogeneity pattern, i.e. the variation of characteristic impedance over distance, of any TX-Line, one can identify the TX-Line with high verification accuracy. The TX-Line PUF information can be extracted using either frequency domain reflectometry (FDR) or time domain reflectometry (TDR) methods. A coaxial cable as short as 2 cm was identified with an equivalent error rate (EER) of below 20 ppm or 0.1%. This can be widely used for identification (ID) and other identification-based applications, such as enabling or enhancing physical layer (PHY) communication link security, TX-Line-based sensing security, supply chain security (e.g., circuit boards and electronic systems), anti-counterfeiting, and manufacturing traceability.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method for analyzing a transmission line, the method comprising:
   an analog wave generator transmitting a travelling wave through a connector into at least a segment of a transmission line;
   an analog receiver measuring backscattered wave reflections as a function of distance along a propagation direction of the segment of the transmission line;
   extracting an impedance inhomogeneity pattern (IIP) from the measured backscattered wave reflection; and
   comparing the IIP with an intrinsic IIP extracted from the segment of the transmission line prior to first use of the transmission line.

2. The method of claim 1 further comprising concluding that the transmission line has been altered or tampered with if the comparing step comprises determining the IIP is sufficiently different from the intrinsic IIP.

3. The method of claim 1 further comprising concluding that the transmission line has not been altered or tampered with and/or that the segment of the transmission line generated the intrinsic IIP if the comparing step comprises determining the IIP is sufficiently identical to the intrinsic IIP.

4. The method of claim 3 further comprising authenticating the transmission line and/or an article which the transmission line is integrated with, embedded in, or attached to.

5. The method of claim 1 repeated for a plurality of segments of the transmission line.

6. The method of claim 1 wherein the analog wave generator generates a pulse comprising a predetermined waveform, and the measuring step comprises directly measuring a back-reflection coefficient as a function of distance using time domain reflectometry.

7. The method of claim 6 wherein the predetermined waveform comprises a step function or an impulse function.

8. The method of claim 1 wherein the analog wave generator comprises a frequency modulated continuous wave source or a broadband wave source.

9. The method of claim 8 wherein a vector network analyzer comprises the analog wave generator and analog receiver.

10. The method of claim 8 comprising using a microwave interferometer to perform homodyne detection.

11. The method of claim 8 wherein the extracting step comprises performing an inverse Fourier transform of complex reflection coefficients obtained in the frequency domain over a bandwidth of the wave source in order to perform frequency domain reflectometry.

12. The method of claim 1 wherein the segment of the transmission line is selected by using time gating.

13. The method of claim 1 wherein the comparing step comprises performing a cross-correlation.

14. The method of claim 1 wherein an equal error rate obtained during the comparing step is less than approximately 0.1%.

15. The method of claim 1 wherein the equal error rate is less than approximately 20 ppm.

16. The method of claim 15 wherein the equal error rate is approximately zero.

17. The method of claim 1 wherein the comparing step comprises using a coherence function.

18. The method of claim 1 wherein a result of the comparing step is approximately independent of a temperature of the transmission line.

19. The method of claim 1 wherein a result of the comparing step is approximately independent of a termination quality of the transmission line.

20. The method of claim 1 wherein the transmission line is selected from the group consisting of two-wire line, twisted pair Ethernet cable, a high speed digital transmission cable, coaxial cable, parallel plate transmission line, microstrip line on a printed circuit board (PCB), stripline on a PCB, coplanar waveguides (CPW) on a PCB, metallic or dielectric waveguide, transmission line on a flexible printed circuit (FPC), flexible flat cable (FFC), on-chip transmission line inside an integrated circuit (IC), high frequency circuit vias, connector, optical fiber, optical waveguide, optical strip waveguide on a photonic integrated circuit (PIC), optical rib waveguide on a PIC, segmented optical waveguide, photonic crystal waveguide, plasmonic waveguide, laser-inscribed optical waveguide, light pipe, fiber-to-chip coupler, acoustic pipe, and combinations thereof.

\* \* \* \* \*

UNITED STATES PATENT AND TRADEMARK OFFICE
CERTIFICATE OF CORRECTION

| | | |
|---|---|---|
| PATENT NO. | : 11,474,141 B1 | Page 1 of 1 |
| APPLICATION NO. | : 16/784130 | |
| DATED | : October 18, 2022 | |
| INVENTOR(S) | : Wei et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 88 days.

Signed and Sealed this
Eighteenth Day of February, 2025

Coke Morgan Stewart
*Acting Director of the United States Patent and Trademark Office*